(12) United States Patent
Tsai et al.

(10) Patent No.: US 11,728,216 B2
(45) Date of Patent: Aug. 15, 2023

(54) SEMICONDUCTOR DEVICE WITH REDUCED CONTACT RESISTANCE AND METHODS OF FORMING THE SAME

(71) Applicant: Taiwan Semiconductor Manufacturing Co., Ltd., Hsinchu (TW)

(72) Inventors: Kuo-Chiang Tsai, Hsinchu (TW); Jhy-Huei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/588,547

(22) Filed: Jan. 31, 2022

(65) Prior Publication Data

US 2022/0157656 A1    May 19, 2022

Related U.S. Application Data

(62) Division of application No. 16/571,358, filed on Sep. 16, 2019, now Pat. No. 11,239,114.

(51) Int. Cl.
| | | |
|---|---|---|
| *H01L 21/768* | (2006.01) | |
| *H01L 23/522* | (2006.01) | |
| *H01L 29/66* | (2006.01) | |
| *H01L 29/78* | (2006.01) | |

(52) U.S. Cl.
CPC .. *H01L 21/76897* (2013.01); *H01L 21/76831* (2013.01); *H01L 21/76832* (2013.01); *H01L 21/76847* (2013.01); *H01L 23/5226* (2013.01); *H01L 29/6656* (2013.01); *H01L 29/66795* (2013.01); *H01L 29/785* (2013.01)

(58) Field of Classification Search
CPC .................................................. H01L 23/5226
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,083,863 B1 * | 9/2018 | Hsieh ................ H01L 21/32134 |
| 2017/0053804 A1 | 2/2017 | Lu et al. |
| 2018/0301371 A1 | 10/2018 | Wang et al. |
| 2021/0082756 A1 | 3/2021 | Tsai et al. |

* cited by examiner

*Primary Examiner* — Yu-Hsi D Sun
(74) *Attorney, Agent, or Firm* — Haynes and Boone, LLP

(57) ABSTRACT

Semiconductor device and the manufacturing method thereof are disclosed herein. An exemplary semiconductor device comprises a substrate; a gate structure disposed over the substrate and over a channel region of the semiconductor device, wherein the gate structure includes a gate stack and spacers disposed along sidewalls of the gate stack, the gate stack including a gate dielectric layer and a gate electrode; a first metal layer disposed over the gate stack, wherein the first metal layer laterally contacts the spacers over the gate dielectric layer and the gate electrode; and a gate via disposed over the first metal layer.

20 Claims, 22 Drawing Sheets

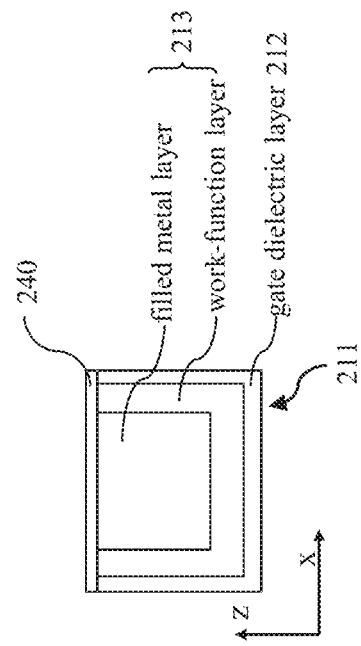
Fig. 5B
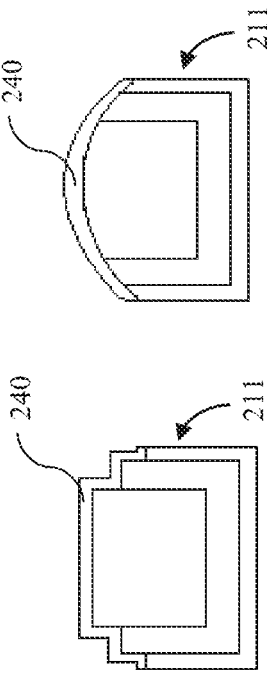
Fig. 5A
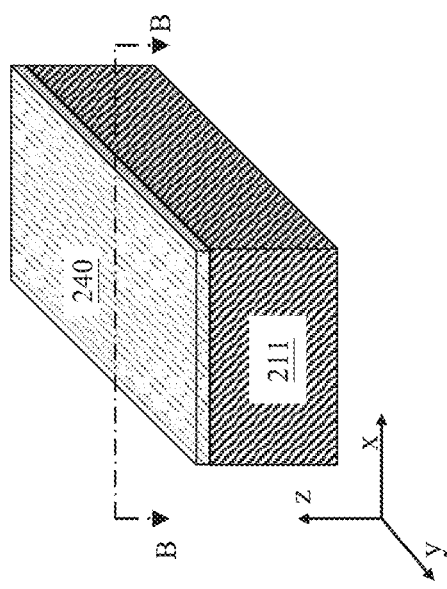
Fig. 5C
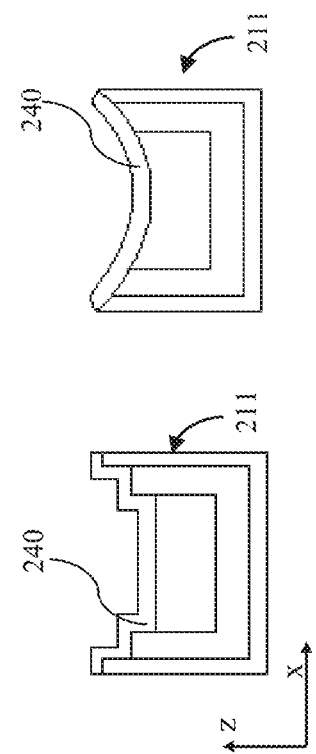
Fig. 5D
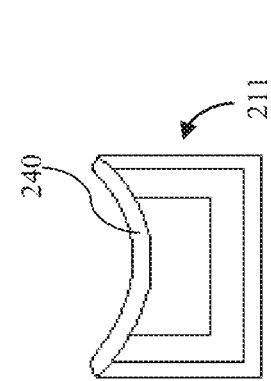
Fig. 5E
Fig. 5F

SEMICONDUCTOR DEVICE WITH REDUCED CONTACT RESISTANCE AND METHODS OF FORMING THE SAME

PRIORITY DATA

The present application is a divisional application of U.S. patent application Ser. No. 16/571,358 filed Sep. 16, 2019, which is herein incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, such scaling down has also increased the complexity of processing and manufacturing ICs and, for these advances to be realized, similar developments in IC processing and manufacturing are needed. For example, it has been observed that the space between gate via and source/drain (S/D) contact is getting smaller and smaller due to the scaling down of the semiconductor device. If the space between the gate via and the S/D contacts is too small, for example, due to an overlay mask shifting during fabrication, current leakage may be induced between the gate and the S/D conductive materials. In addition, the resistance between the metal gate and gate via and the resistance between the S/D contacts and S/D via are high because of the small contact surfaces and different conductive materials between the metal gate and gate via and between the S/D contacts and the S/D via. Accordingly, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5A illustrates a three-dimension perspective view of the contact profile between the gate electrode and the first metal layer of the example semiconductor device in accordance with some embodiments of the present disclosure;

FIGS. 5B-5F illustrate cross-sectional views along plane B-B shown in FIG. 5A of the contact profile between the gate electrode and the first metal layer of the example semiconductor device in accordance with some embodiments of the present disclosure;

DETAILED DESCRIPTION

Figure 1:
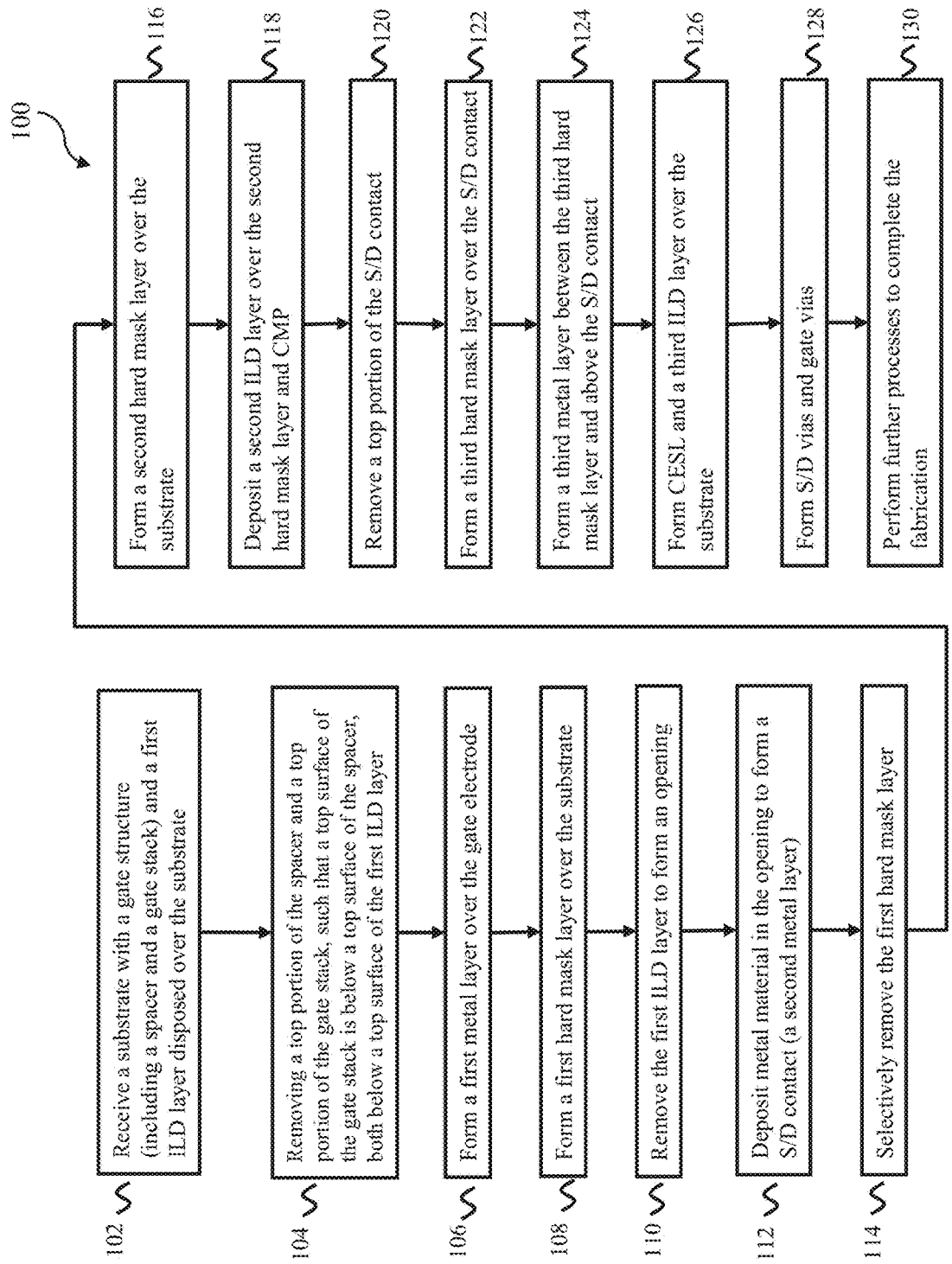
FIG. 1 illustrates a flowchart of an example method for making a semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof. Due to the scaling down of the semiconductor device, the geometry size between different components of the semiconductor device is getting smaller and smaller which may cause some issues and damage the performance of the semiconductor device. For example, in a conventional fabrication, due to the hard mask overlay shifting and/or fabrication deviation, the space between the gate via and the S/D contacts may be very small. Current leakage may be occurred due to the short path between the gate via and the S/D contact. This may induce low yield and damage the performance of the semiconductor device. In addition, there is always a need to reduce the resistance between the metal gate and the gate via, and/or between the S/D contacts and the S/D via.

The present disclosure provides a semiconductor device with hard mask isolation between the gate via and the S/D contact. The hard mask isolation may comprise one or more layers which can provide a safe space between the gate via and the S/D contact, thereby to mitigate the occurrence of the current leakage therebetween. In addition, to reduce the resistance between the gate and gate via and/or between the S/D contact and S/D via, the present disclosure also provides a semiconductor device with extra metal layers disposed between the gate and gate via and/or between the S/D contact and S/D via. The extra metal layers include the same material as the via and enlarge the contact surface between the contact (for example, the metal gate or the S/D contact) and the via (for example, the gate via or the S/D via), thereby to reduce the contact resistance therebetween. Accordingly, the performance of the semiconductor device may be improved. Of course, these advantages are merely exemplary, and no particular advantage is required for any particular embodiment.

Figure 2:
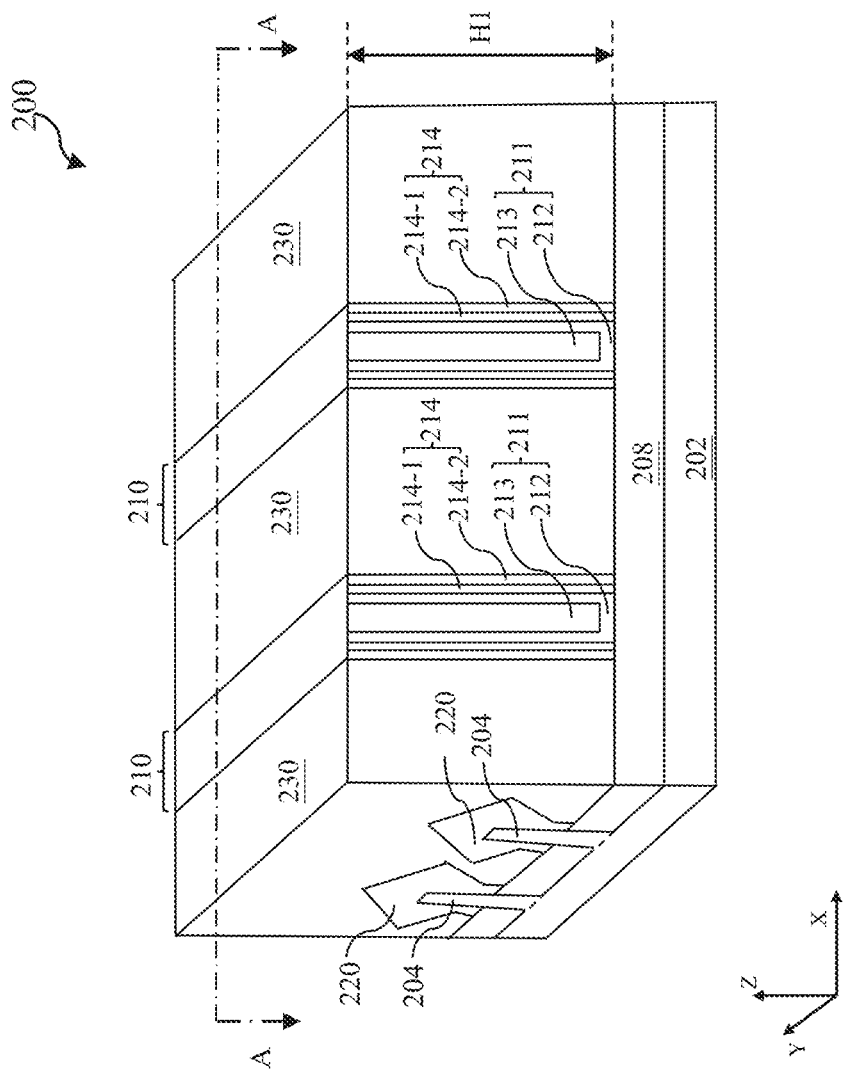
FIG. 2 illustrates a three-dimensional perspective view of an example semiconductor device in accordance with some embodiments of the present disclosure.

FIG. 1 illustrates a flow chart of a method 100 for forming a semiconductor device 200 (hereafter called "device 200" in short) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional and cross-sectional views of device 200 during intermediate steps of method 100. In particular, FIG. 2 illustrates a three-dimensional view of device 200 initially provided. FIGS. 3, 4, 6-15, 17 and 18 illustrate cross-sectional views of device 200 taken along plane A-A shown in FIG. 2 (that is, along an x-direction).

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations. For example, though device 200 as illustrated is a three-dimensional FET device, the present disclosure may also provide embodiments for fabricating planar FET devices.

Referring to FIGS. 1 and 2, at operation 102, method 100 provides a semiconductor device 200. Semiconductor device 200 includes one or more fins 204 protruding from a substrate 202 and separated by an isolation structure 208. One or more gate structures 210 are disposed over substrate 202 and fins 204. Gate structures 210 defines a channel region (covered by gate structures 210), a source region and a drain region (both referred to as source/drain (S/D) regions) of fins 204. Gate structures 210 may include gate stacks 211 and gate spacers 214 disposed along sidewalls of gate stacks 211. Gate structures 210 may include other components such as one or more gate dielectric layers disposed over substrate 202 and below gate stacks 211, a barrier layers, a glue layer, a capping layer, other suitable layers, or combinations thereof. Various gate hard mask layers may be disposed over gate stacks 211 and may be considered a part of gate structures 210. Device 200 may also include S/D features 220 epitaxially grown over the S/D regions of fins 204. Device 200 may also include interlayer dielectric (ILD) layer 230 disposed over substrate 202 and fins 204 and between gate structures 210. It is understood components included in device 200 are not limited to the numbers and configurations as shown in FIG. 2. More or less components, for example, more or less gate structures and/or S/D features, may be included in device 200.

In the depicted embodiment of FIG. 2, device 200 comprises a substrate (wafer) 202. In the depicted embodiment, substrate 202 is a bulk substrate that includes silicon. Alternatively or additionally, the bulk substrate includes another elementary semiconductor, a compound semiconductor, an alloy semiconductor, or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 may include various doped regions. In some embodiments, substrate 202 includes n-type doped regions (for example, n-type wells) doped with n-type dopants, such as phosphorus (for example, $^{31}$P), arsenic, other n-type dopant, or combinations thereof. In some embodiments, substrate 202 includes p-type doped region (for example, p-type wells) doped with p-type dopants, such as boron (for example, $^{11}$B, $BF_2$), indium, other p-type dopant, or combinations thereof. An ion implantation process, a diffusion process, and/or other suitable doping process can be performed to form the various doped regions.

Semiconductor fins 204 are formed over substrate 202. Each fin 204 may be suitable for providing an n-type FET or a p-type FET. Fins 204 are oriented substantially parallel to one another. Each of fins 204 has at least one channel region and at least one source region and one drain region defined along their length in the x-direction, where the at least one channel region is covered by gate structures and is disposed between the S/D regions. In some embodiments, fins 204 are portions of substrate 202 (such as a portion of a material layer of substrate 202). For example, in the depicted embodiment, where substrate 202 includes silicon, fins 204 include silicon. Alternatively, in some embodiments, fins 204 are defined in a material layer, such as one or more semiconductor material layers, overlying substrate 202. For example, fins 204 can include a semiconductor layer stack having various semiconductor layers (such as a heterostructure) disposed over substrate 202. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on the design requirement of device 200. Fins 204 are formed by any suitable process including various deposition, photolithography, and/or etching processes.

Isolation structure 208 is formed over substrate 202 and separates the lower portions of fins 204. Isolation structure 208 electrically isolates active device regions and/or passive device regions of device 200. Isolation structure 208 can be configured as different structures, such as a shallow trench isolation (STI) structure, a deep trench isolation (DTI) structure, a local oxidation of silicon (LOCOS) structure, or combinations thereof. Isolation structure 208 includes an isolation material, such as silicon oxide, silicon nitride, silicon oxynitride, other suitable isolation material, or combinations thereof. Isolation structure 208 is deposited by chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low pressure CVD (LPCVD), atomic layer CVD (ALCVD), atmospheric pressure CVD (APCVD), other suitable deposition process, or combinations thereof. In some embodiments, isolation structure 208 is formed before fins 204 are formed (an isolation-first scheme). In some other embodiments, fins 204 are formed before isolation structure 208 is formed (a fin-first scheme). A planarization process, such as a chemical mechanical polishing (CMP) process, can be performed on isolation structure 208.

In the depicted embodiment of FIG. 2, various gate structures 210 are formed over fins 204. Gate structures 210 extend along a y-direction and are disposed substantially parallel to one another. Gate structures 210 engage the respective channel regions of fins 204, such that current can flow between the respective S/D regions of fins 204 during operation. Each gate structure 210 may comprise a gate stack 211 and spacers 214. Gate stack 211 may comprise a gate dielectric layer 212, a gate electrode 213, a hard mask layer (not shown), and/or other suitable layers. Gate dielectric layer 212 may include a high-k dielectric material, which is a material having a dielectric constant that is greater than a dielectric constant of silicon dioxide ($SiO_2$), which is approximately 3.9. Gate electrode 213 may include metal-containing materials. In some embodiments, gate electrodes 213 may include a work function metal component and a fill metal component. The work functional metal component is configured to tune a work function of its corresponding FET to achieve a desired threshold voltage Vt. In various embodiments, the work function metal component may contain TiAl, TiAlN, TaCN, TiN, WN, W, other suitable material, or combinations thereof. The fill metal component is configured to serve as the main conductive portion of the functional gate structure. In various embodiments, the fill metal component may comprise Aluminum (Al), Tungsten (W), Copper (Cu), or combinations thereof. Each of the gate structures 210 has a gate length along the x-direction between the S/D regions.

Spacers 214 are disposed along the sidewalls of gate stacks 211. Spacers 214 may comprise one or more dielectric layers and pattern layers. For example, as depicted in FIG. 2, spacers 214 comprises a dielectric layer 214-1 disposed along sidewalls of gate stacks 211 and a pattern layer 214-2 disposed along sidewalls of dielectric layer 214-1. In some embodiments, dielectric layer 214-1 may include any suitable dielectric material, such as silicon, oxygen, carbon, nitrogen, other suitable material, or combinations thereof (for example, silicon oxide (SiO), silicon nitride (SiN), silicon oxynitride (SiON), or silicon carbide (SiC), low-k (k<3.9) dielectric). In some embodiments, pattern layer 214-2 may include any suitable material that has a different etch rate than the dielectric layer, such as silicon nitride (SiN), silicon carbon nitride (SiCN), silicon oxycarbonitride (SiOCN), other suitable dielectric materials, or combinations thereof. For example, pattern layer 214-2 of spacer 214 includes nitride-rich SiN, wherein a molar ratio of the nitride is about 20% to about 60% (for example, more than 50%). Formation of spacers 214 may include various steps. For example, first, a dielectric layer 214-1 is formed conformally over substrate 202, and a pattern layer 214-2 is formed conformally over dielectric layer 214-1. Dielectric layer 214-1 may be formed by any suitable method, such as ALD, CVD, PVD, other suitable methods, or combinations thereof. Pattern layer 214-2 may be deposited by any suitable method, such as ALD, to any suitable thickness. Subsequently, top portions of dielectric layer 214-1 and pattern layer 214-2 are removed by an anisotropic etching process or any other suitable process. The etching process may be a dry etching process, a wet etching process, a reactive ion etching (RIE) process, or combinations thereof. The remaining portions of dielectric layer 214-1 and pattern layer 214-2 form gate spacers 214.

In some other embodiments, gate structures 210 are formed by a gate replacement process after other components (for example, epitaxial S/D features 220 and the first ILD layer 230) of device 200 are fabricated. In a gate replacement process, dummy gate structures are formed over the channel regions of fin 204. Each dummy gate structure may include a dummy gate electrode comprising polysilicon (or poly) and various other layers, for example, a hard mask layer disposed over dummy gate electrode, and an interfacial layer disposed over fins 204 and substrate 202 and below the dummy gate electrode. Spacers 214 are then formed along sidewalls of the dummy gate structure by any suitable method that aforementioned. After the formation of epitaxial S/D features 220 as well as the first ILD layer 230, dummy gate structures are removed along spacers 214 using one or more etching processes (such as wet etching, dry etching, RIE, or other etching techniques), therefore leaving openings over the channel regions of fins 204 in place of the removed dummy gate structures. The openings are then filled with dielectric materials to form gate dielectric layers 212 by various processes, such as ALD, CVD, PVD, and/or other suitable process. Metal gate materials (for example, gate electrode 213 including work function components and metal fill components) are then deposited over the gate dielectric layers to form metal gate stacks 211. Gate stacks 211 are formed by various deposition processes, such as ALD, CVD, PVD, and/or other suitable process. A CMP process can be performed to remove any excess materials of gate stacks 211 and/or spacers 214 to planarize gate structures 210.

In some embodiments, a height H1 of gate structures 210 as well as the first ILD layer 230 along a z-direction is about 30 nm to about 60 nm.

Still referring to FIG. 2, device 200 also includes epitaxial S/D features 220 formed in the source/drain regions of fins 204. For example, semiconductor material (such as silicon germanium (SiGe), silicon phosphide (SiP) or silicon carbide (SiC)) is epitaxially grown on fins 204, forming epitaxial S/D features 220 on fins 204. In furtherance of some embodiments, epitaxial source/drain features 220 extend (grow) laterally along the y-direction, such that epitaxial source/drain features 220 are merged epitaxial source/drain features that span more than one fin. In some embodiments, epitaxial source/drain features 220 include partially merged portions and/or fully merged portions. In some other embodiments, epitaxial source/drain features 220 are separated over respective fins 204 and are not merged laterally. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fins 204. In some embodiments, where an N-type FET device is desired, S/D features 220 may include epitaxially grown silicon (epi Si). Alternatively, where a P-type FET device is desired, S/D features 220 may include epitaxially grown silicon germanium (SiGe). In some embodiments, S/D features 220 may be in-situ doped or undoped during the epitaxy process. In some embodiments, S/D features 220 are doped with n-type dopants (such as phosphorus or arsenic) and/or p-type dopants (such as boron or BF2) depending on a type of FET fabricated in their respective FET device region. In some embodiments, S/D features 220 include materials and/or dopants that achieve desired tensile stress and/or compressive stress in the channel regions. In some embodiments, epitaxial S/D features 220 are doped during deposition by adding impurities to a source material of the epitaxy process. In some embodiments, epitaxial S/D features 220 are doped by an ion implantation process subsequent to a deposition process. In some embodiments, annealing processes are performed to activate dopants in epitaxial S/D features 220 of device 200.

Still referring to FIG. 2, device 200 comprises a first interlayer dielectric (ILD) layer 230 formed over source/drain regions of substrate 202, and between gate structures 210. In some embodiment, the first ILD layer 230 may include silicon oxide (SiO), silicon nitride (SiN), silicon oxynitride (SiON), tetraethylorthosilicate (TEOS) formed oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. The first ILD layer 230 includes a dielectric material that is different than a material of spacers 214, especially spacer patter layers 214-2, to achieve etching selectivity during subsequent etching processes. For example, where spacer patter layers 214-2 include nitride-rich SiN, wherein a molar ratio of the nitride is about 20% to about 60% (for example, more than 50%), the first ILD layer 230 includes oxide-rich $SiO_2$, wherein a molar ratio of the oxide is about 20% to about 60% (for example, more than 50%). In some embodiments, the first ILD layer 230 has a multilayer structure having multiple dielectric materials. In some embodiments, the first ILD layer 230 may be formed by a deposition process (such as CVD, FCVD, PVD, ALD, HDPCVD, MOCVD, RPCVD, PECVD, LPCVD, ALCVD, APCVD, plating, other suitable methods, or combinations thereof) to cover substrate 202, S/D features 220 and gate structures 210. Subsequent to the deposition of the first ILD layer 230, a CMP process and/or other planarization process may be performed to expose gate structures 210.

Figure 3:
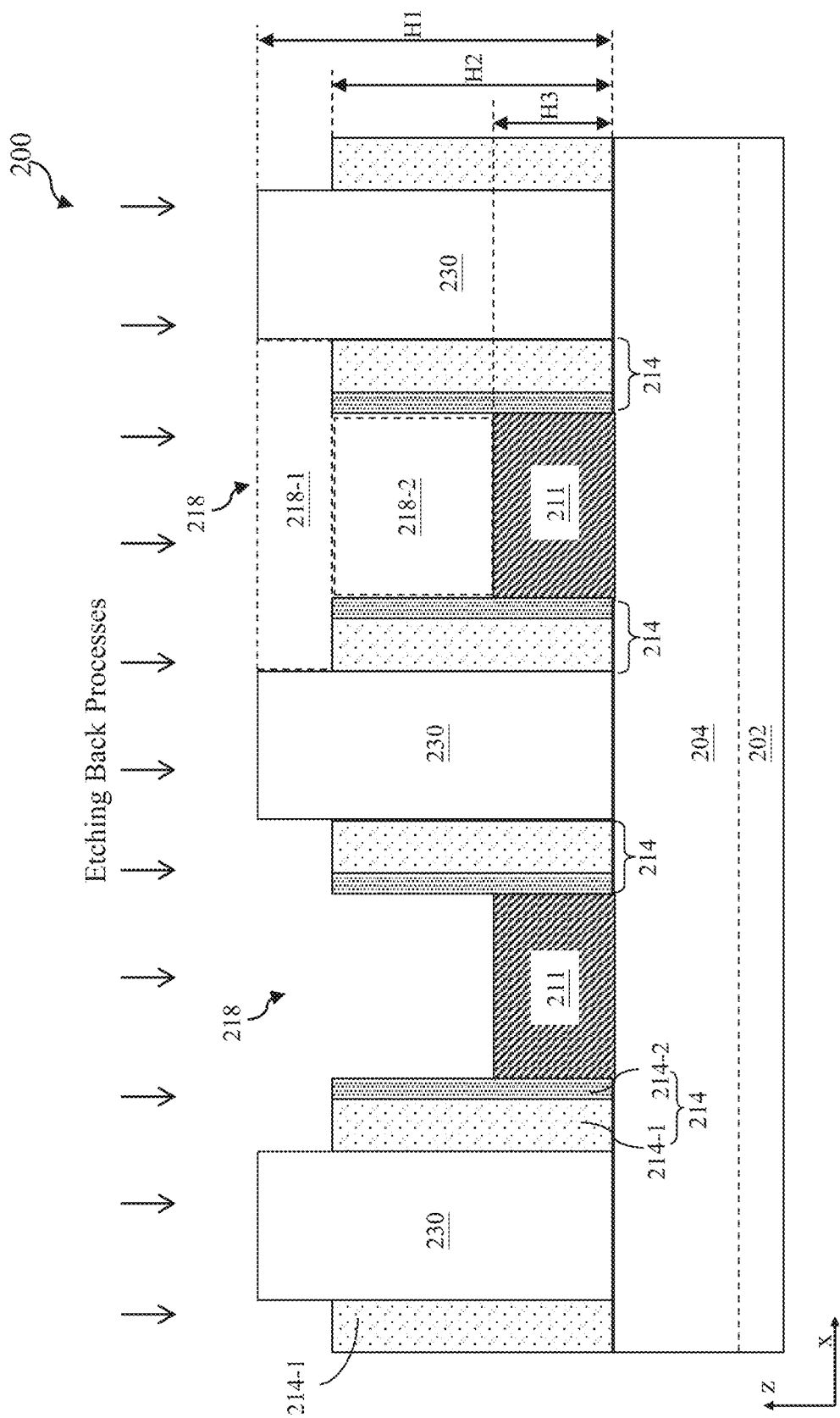
FIGS. 3, 4, 6-15, 17, and 18 illustrate cross-sectional views along plane A-A shown in FIG. 2 of the example semiconductor device at intermediate stages of the method of FIG. 1 in accordance with some embodiments of the present disclosure.

Now referring to FIGS. 1 and 3, at operation 104, gate structures 210 including gate stacks 211 and spacers 214 are recessed such that each of the gate stacks 211 and spacers 214 has a top surface below a top surface of the first ILD layer 230. In some embodiments, as depicted in FIG. 3, gate stacks 211 and spacers 214 are recessed to different heights such that a top surface of gate stacks 211 is below a top surface of spacers 214, and both below a top surface of the first ILD layer 230. The recessing process may comprise more than one steps. For example, in a first step, gate structures 210 including gate stacks 211 and spacers 214 are recessed to a height H2, which is less than a height H1 of the first ILD layer 230; subsequently, in a second step, gate stacks 211 are further recessed to a height H3 which is less than the height H2 of spacers 214. The recess processes may include different etching processes, for example, dry etch, wet etch, or a combination thereof. In some embodiments, gate structures 210 including gate stacks 211 and spacers 214 are recessed via selective dry etching from a height H1 to a height H2, and then the gate stacks 211 are further recessed via a combination of wet etching and dry etching to a height H3. In the depicted embodiment, a T-shape trench 218 is formed over gate structures 210 including gate stack 211 and spacers 214 and between the first ILD layer 230. As depicted in FIG. 3, trench 218 includes a top portion 218-1 and a bottom portion 218-2, which forms a cross view of a "T" shape in the x-z plane, wherein the top portion 218-1 has a larger opening than the bottom portion 218-2. In the depicted embodiment, top portion 218-1 of trench 218 is over the top surface of spacers 214 and surrounded by a portion of sidewalls of the first ILD layer 230 and bottom portion 218-2 of trench 218 is over the top surface of gate stack 211 and below the top surface of spacers 214 and is surrounded by a portion of sidewalls of spacers 214.

In some embodiments, the height H1 of the first ILD layer 230 along the z-direction is about 30 nanometers (nm) to about 60 nm; the height H2 of spacer 214 along the z-direction is about 20 nm to about 40 nm which is about 5 nm to about 20 nm lower than the height H1 of the first ILD layer 230. In some further embodiments, the height H2 of spacers 214 is about 50% to about 80% of the height H1 of the first ILD layer 230. In some embodiment, the height H3 of gate stack 211 along the z-direction is about 5 nm to about 20 nm, which is about 10 nm to about 30 nm lower than the height H2 of spacers 214. In some further embodiments, the height H3 of gate stack 211 is about 30% to about 50% of the height H2 of spacers 214, which is about 20% to about 40% of the height H1 of the first ILD layer 230. In the depicted embodiment of FIG. 3, the height H1 of the first ILD layer 230 is about 40 nm, the height H2 of spacers 214 is about 30 nm, and the height H3 of gate stack 211 is about 10 nm. In a convention structure of the semiconductor device, the spacer is about the same height as the ILD layer; and a height of the gate electrode is about 50% of the height of the spacer and the ILD layer. Therefore, in the present disclosure, the height difference between the gate stack 211 and the spacers 214 is larger compare to the convention structure of the semiconductor device, and further the height difference between the gate stack 211 and the first ILD layer 230 is larger compare to the convention structure of the semiconductor device. This may enlarge the distance between the gate stack 211 and the later formed S/D via 280 (shown in FIG. 18). In addition, T-shape trench 218 will be filled with low-k ILD material (shown in FIG. 18) which can provide better isolation than the material of spacers 214. Thereby, the isolation between the gate electrode and the S/D via and the isolation between the S/D contacts and the gate via in the present disclosure is improved, the leakage issue caused by the overlay shifting during the fabrication may be mitigated.

Figure 4:
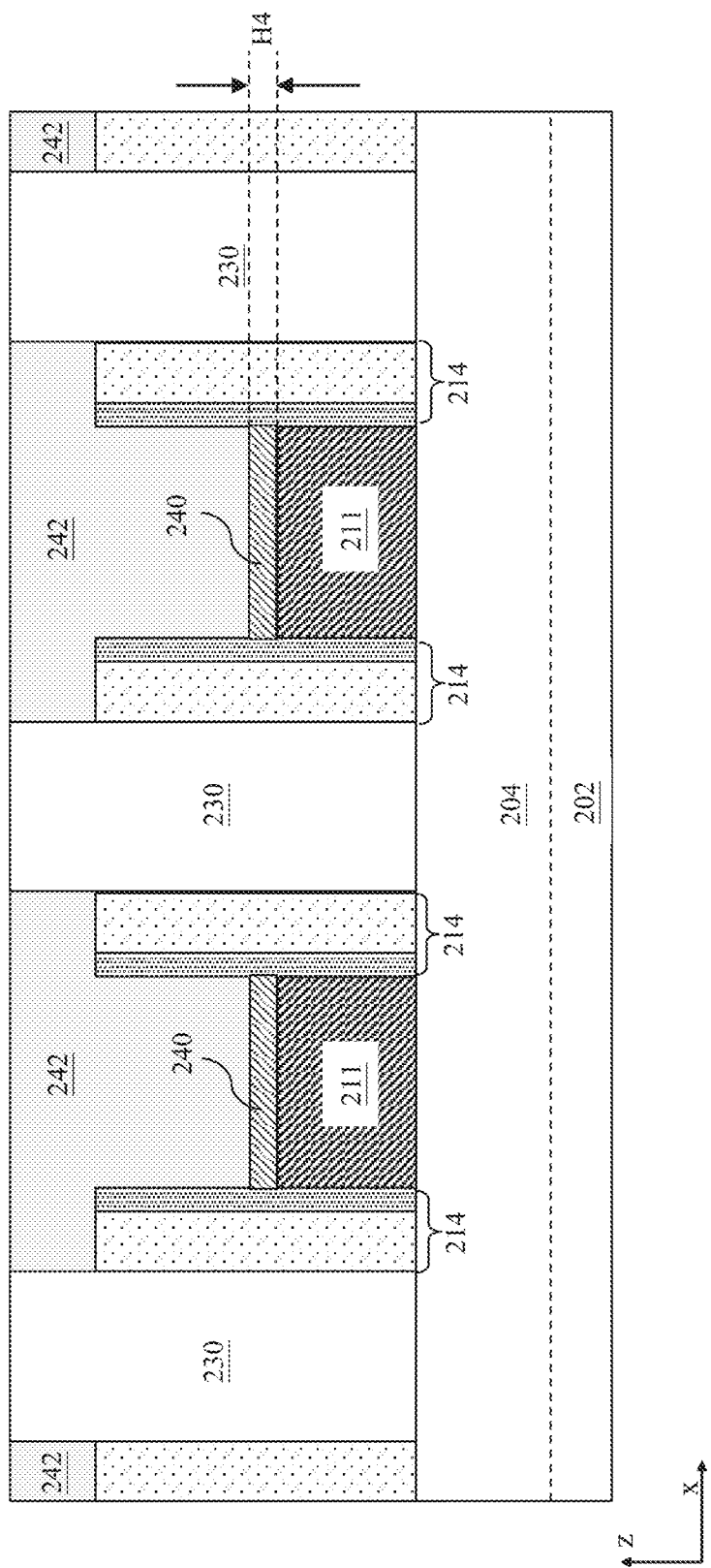

Referring to FIGS. 1, 4, and 5A, at operation 106, a first metal layer 240 is deposited over gate stacks 211. As depicted in FIG. 5A, the first metal layer 240 is disposed to substantially cover the entire top surface of the gate stack 211, along both the x-direction (gate length direction) and the y-direction (a direction that is perpendicular to the gate length direction). As depicted in FIG. 4, a top surface of the first metal layer 240 is below the top surface of spacer 214. And, the first metal layer 240 laterally contacts the sidewalls of spacers 214. In some embodiment, the first metal layer 240 comprises metal materials such as tungsten (W), cobalt (Co), aluminum (Al), zirconium (Zr), gold (Au), platinum (Pt), copper (Cu), ruthenium (Ru), metal compound, or combinations thereof. In some embodiments, the material of the first metal layer 240 is different than the material of gate stacks 211. In some further embodiments, the material of the first metal layer 240 is the same as the gate via 290 (shown in FIG. 18) formed later. In some embodiments, the first metal layer 240 is formed by a bottom-up grow process from gate stacks 211. A catalyst comprising tungsten may be applied to facilitate the bottom-up growth of the first metal layer 240. In some embodiments, a thickness H4 of the first metal layer 240 is about 10% to about 30% of a height H3 of gate stack 211. For example, a thickness H4 of the first metal layer 240 along the z-direction is about 1 nm to about 10 nm. In the depicted embodiment of FIG. 4, the thickness H4 of the first metal layer 240 is about 3 nm.

In the depicted embodiment, the first metal layer 240 is grown to cover the entire top surface of gate stack 211, even though the top surface of gate stack 211 may or may not be flat after the recess process of operation 104. FIGS. 5B-5F illustrates cross-section views of the contact profile between the first metal layer 240 and gate stack 211 along plane B-B of FIG. 5A according to various embodiments of the present disclosure. As depicted in FIGS. 5B-5F, gate stack 211 may comprises a gate dielectric layer 212 comprising high-k dielectric materials. The dielectric layer may be disposed as a U-shape along the sidewalls of spacers 214 and over the top surface of substrate 202. Gate stack 211 also comprises a gate electrode 213 including a work-function layer and a filled metal layer. The work-function layer comprises work-function metal material and may be formed conformally along the gate dielectric layer 212. The filled metal layer comprises metal material and may be disposed to fill in a trench formed in the work-function layer. Gate stack 211 may comprise other layers which are not shown in FIGS. 5B-5F. Therefore, a top surface of gate stack 211 may comprise high-k dielectric materials (gate dielectric layer 212) and conductive/metal materials (gate electrode 213). Due to different etching rate of the different materials, a top surface of gate stack 211 after the recess process of operation 104 may be of various shapes, as depicted in FIGS. 5B-5F. For example, a top surface of gate stack 211 may be a flat surface (FIG. 5B), a stepped U-shape (FIG. 5C), a continuous U-shape (FIG. 5D), a stepped ∩-shape (FIG. 5E), or a continuous ∩-shape (FIG. 5F). No matter what shape the top surface of gate stack 211 is, the first metal layer 240 is bottom-up grown from the metal/conductive materials and extending to the dielectric materials to cover the entire surface of gate stack 211, conformally or non-conformally.

As shown in FIG. 5A, the contact surface between gate stacks 211 and the first metal layer 240 is the entire top surface of the gate stack 211, which is much larger than the contact surface between the gate via and the gate electrode as in a conventional structure. In addition, the first metal layer 240 may include a same conductive material as the later formed gate via 290, the resistance between the gate via and the first metal layer is very small and may be ignored. Thereby, since the contact resistance is inversely proportional to the contact area, the contact resistance between the metal gate (for example, gate stacks 211) and the gate via (for example, gate via 290 recited in FIG. 18) may be reduced, and the device performance may be improved.

Still referring to FIGS. 1 and 4, at operation 108, a sacrificial layer 242 is deposited over substrate 202. A material of sacrificial layer 242 may comprises silicon, silicon compound, nitride compound, oxide compound, for example, silicon oxide (SiO), silicon nitride (SiN), silicon oxynitride (SiON), silicon carbonitride (SiCN), silicon oxycarbonitride (SiOCN), other dielectric materials, or combinations thereof. In some embodiment, a material of sacrificial layer 242 is different (have different etching selectivity) than a material of spacers 214 and the first ILD layer 230. For example, sacrificial layer 242 includes silicon-rich SiN, wherein a molar ratio of the silicon is about 20% to about 60% (for example, more than 50%); spacer pattern layers 214-2 includes nitride-rich SiN, wherein a molar ratio of the nitride is about 20% to about 60% (for example, more than 50%), and the first ILD layer 230 includes oxide-rich $SiO_2$, wherein a molar ratio of the oxide is about 20% to about 60% (for example, more than 50%). Sacrificial layer 242 may be deposited by CVD, PVD, ALD, other deposition process, or combinations thereof. A planarization process (for example, CMP) may then be applied to remove the top portion of sacrificial layer 242 until the first ILD layer 230 is exposed.

Figure 6:
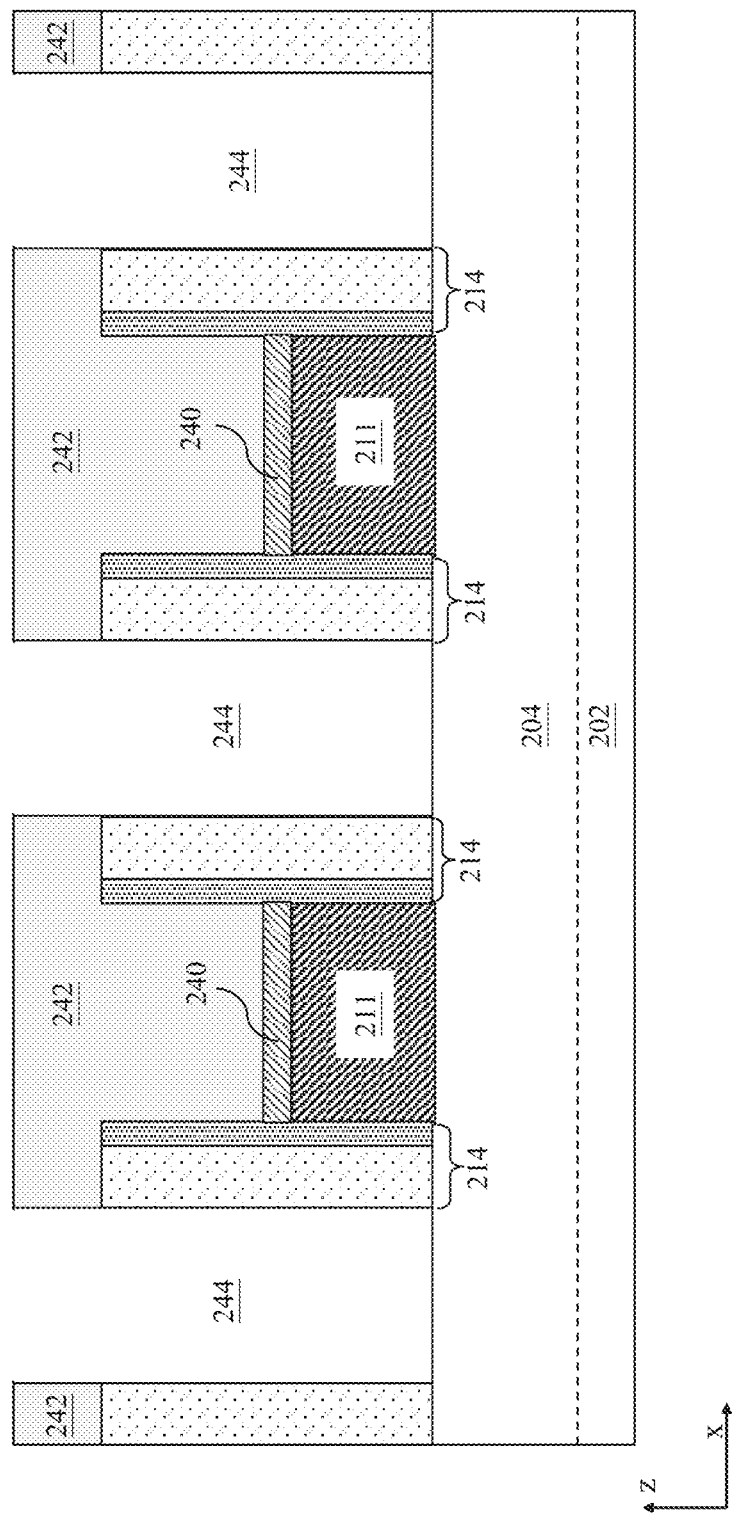

Referring to FIGS. 1 and 6, at operation 110, the first ILD layer 230 is etched along sidewalls of sacrificial layer 242 and spacers 214 (specially spacer patter layer 214-2), therefore leaving contact openings 244 over the source/drain regions of device 200 in place of the removed first ILD layer. Since a material of the first ILD layer 230 has different etching selectivity than a material of spacer pattern layer 214-2 and the sacrificial layer 242, a selective etching process only removes the first ILD layer 230 without damage spacers 214 and sacrificial layer 242. In some embodiments, as depicted in FIG. 6, the first ILD layer 230 is substantially completely removed, thus contact openings 244 have bottom surfaces over the source/drain regions of device 200 and sidewalls formed by the sidewalls of spacers 214 and sidewalls of sacrificial layer 242. In some embodiments, the first ILD layer 230 may not be completely removed. In a later process, conductive materials (i.e. S/D contacts 250 in FIG. 7) may be filled in contact openings 244 to form S/D contacts 250, such that the critical dimension (CD) of the source/drain contacts may be maximized by this self-aligned S/D contacts formation process which is helping in reducing the S/D resistance and enlarging the S/D via alignment window. In some embodiments, the selective etching process to the first ILD layer 230 may include wet etching, dry etching, RIE, or combinations thereof.

Figure 7:
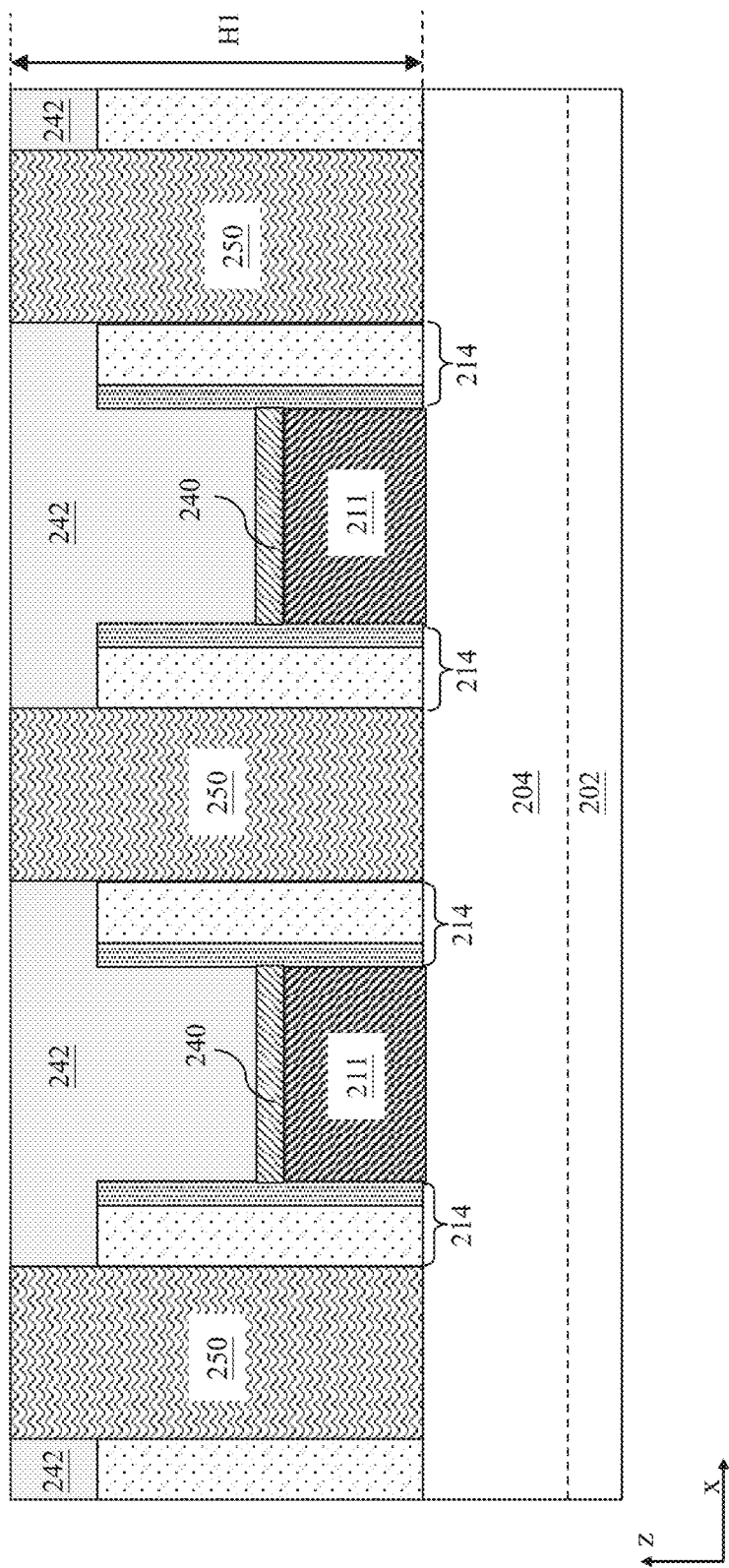

Referring to FIGS. 1 and 7, at operation 112, conductive materials are deposited in contact openings 244 to form S/D contacts 250. In some embodiments, S/D contacts 250 may comprise tungsten (W), cobalt (Co), tantalum (Ta), titanium (Ti), aluminum (Al), zirconium (Zr), gold (Au), platinum (Pt), copper (Cu), ruthenium (Ru), metal compound such as titanium nitride (TiN), tantalum nitride (TaN), or combinations thereof. S/D contacts 250 may be formed by suitable deposition process, such as CVD, PVD, ALD, and/or other suitable process. A CMP process may be performed to remove any excess material of S/D contacts 250 such that the top surface of S/D contacts 250 is substantially coplanar with sacrificial layer 242. In the depicted embodiment of FIG. 7, a height S/D contacts 250 along the z-direction is the same as H1, which is about 30 nm to about 60 nm. As discussed above, due to the self-aligned formation process, the CD of S/D contacts 250 is maximized.

Figure 8:
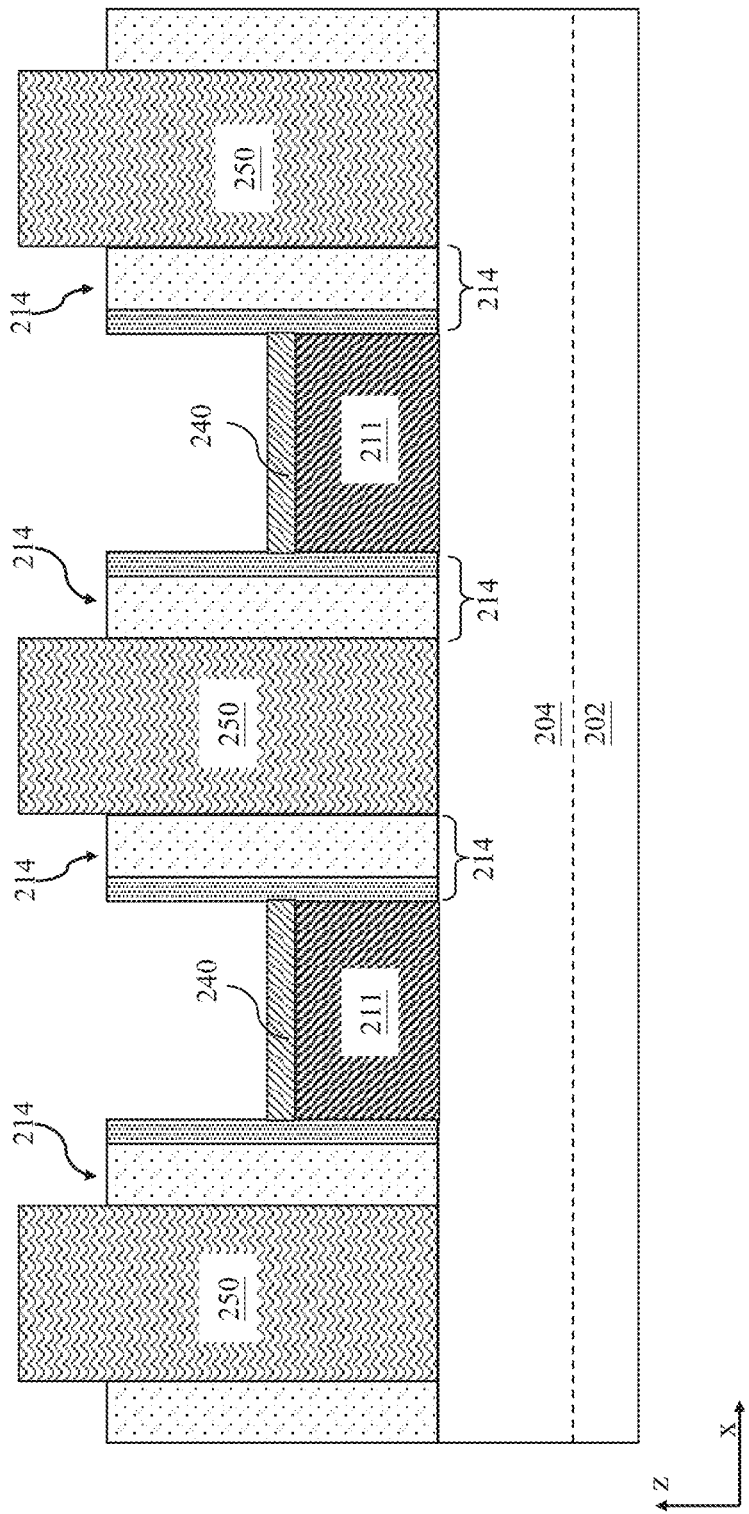

Referring to FIGS. 1 and 8, at operation 114, sacrificial layer 242 is removed. Because of the high selective etching ratio between the material of sacrificial layer 242 (for example, including silicon-rich SiN) and spacers 214 (for example, including nitride-rich SiN), a selective dielectric etching process may be applied to remove sacrificial layer 242. The selective dielectric etching may substantially completely remove the sacrificial layer 242 and stop on spacers 214 and the metal layers including the first metal layers 240 and the S/D contacts 250.

Figure 9:
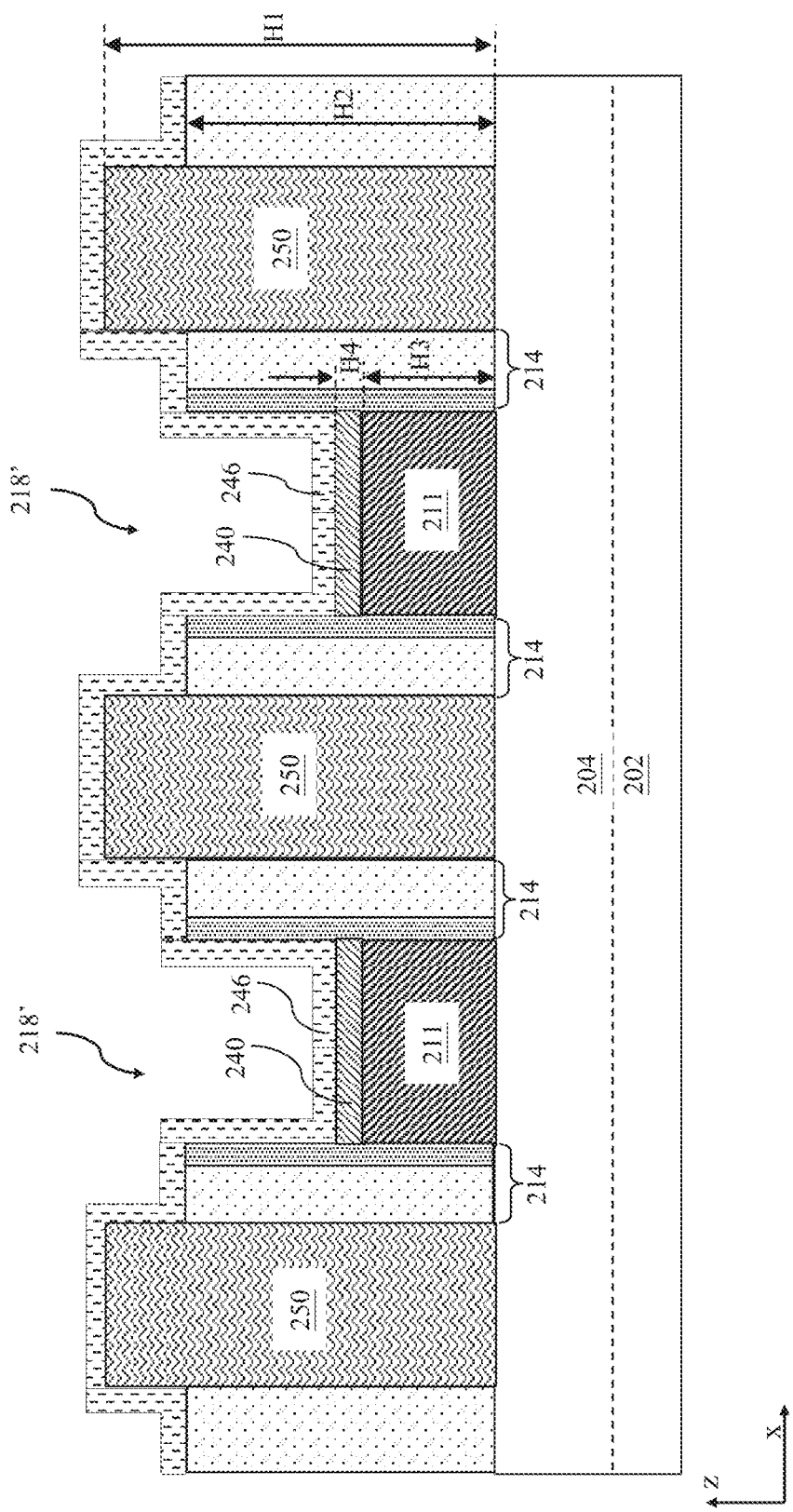

Referring to FIGS. 1 and 9, at operation 116, a first isolation feature 246 is deposited in T-shape trench 218 over substrate 202. In some embodiments, the first isolation feature 246 may comprises a dielectric material including, for example, silicon oxide (SiO), silicon nitride (SiN), silicon oxynitride (SiON), silicon oxycarbonitride (SiOCN) silicon carbonitride (SiCN), other silicon compound, nitride compound, oxide compound, or combinations thereof. The material of the first isolation feature 246 should provide good hardness and good isolation between the conductive materials of different contacts and/or vias according to the design requirement of device 200. In some implementations, the first isolation feature 246 may include a multilayer structure having multiple dielectric materials. The first isolation feature 246 is conformally formed in T-shape trench 218 by a deposition process. In the depicted embodiment of FIG. 9, the first isolation feature 246 is conformally formed by an ALD process over the first metal layer 240, extending along a top portion of the sidewalls of spacers 214 (that is above the top surface of the first metal layer 240) to the top surface of spacers 214, further extending along the sidewalls of a top portion of S/D contacts 250 (that is above the top surface of spacers 214) to the top surface of S/D contacts 250. In the depicted embodiment, the first isolation feature 246 are conformally deposited such that the thicknesses of the first isolation feature 246 along different directions are substantially the same. In some embodiments, a thickness of the first isolation feature 246 is about 10% to about 30% of a height of the gate electrode. For example, the thickness of the second hard mask layer is about 1 nm to about 10 nm. In the depicted embodiment of FIG. 9, the thickness of the first isolation feature 246 is about 3 nm. Since the first isolation feature 246 is conformally deposited in T-shape trench 218, smaller T-shape openings 218' formed above the first isolation feature 246, as depicted in FIG. 9. T-shape openings 218' has a cross view of a "T" shape in the x-z plane, where a top portion has a larger opening than a bottom portion of T-shape openings 218'. Compare with a convention structure where no extra dielectric layer is provided between various contacts and vias, the first isolation feature 246 in the present disclosure can provide enhanced isolation between the source/drain contact (for example, the S/D contacts 250) and the gate via (for example, gate via 290 in FIG. 18) and between the metal gate (for example, the gate stack 211) and the S/D via (for example, S/D via 280 in FIG. 18), thereby can mitigate the current leakage issue caused by the overlay shifting during the fabrication.

Figure 10:
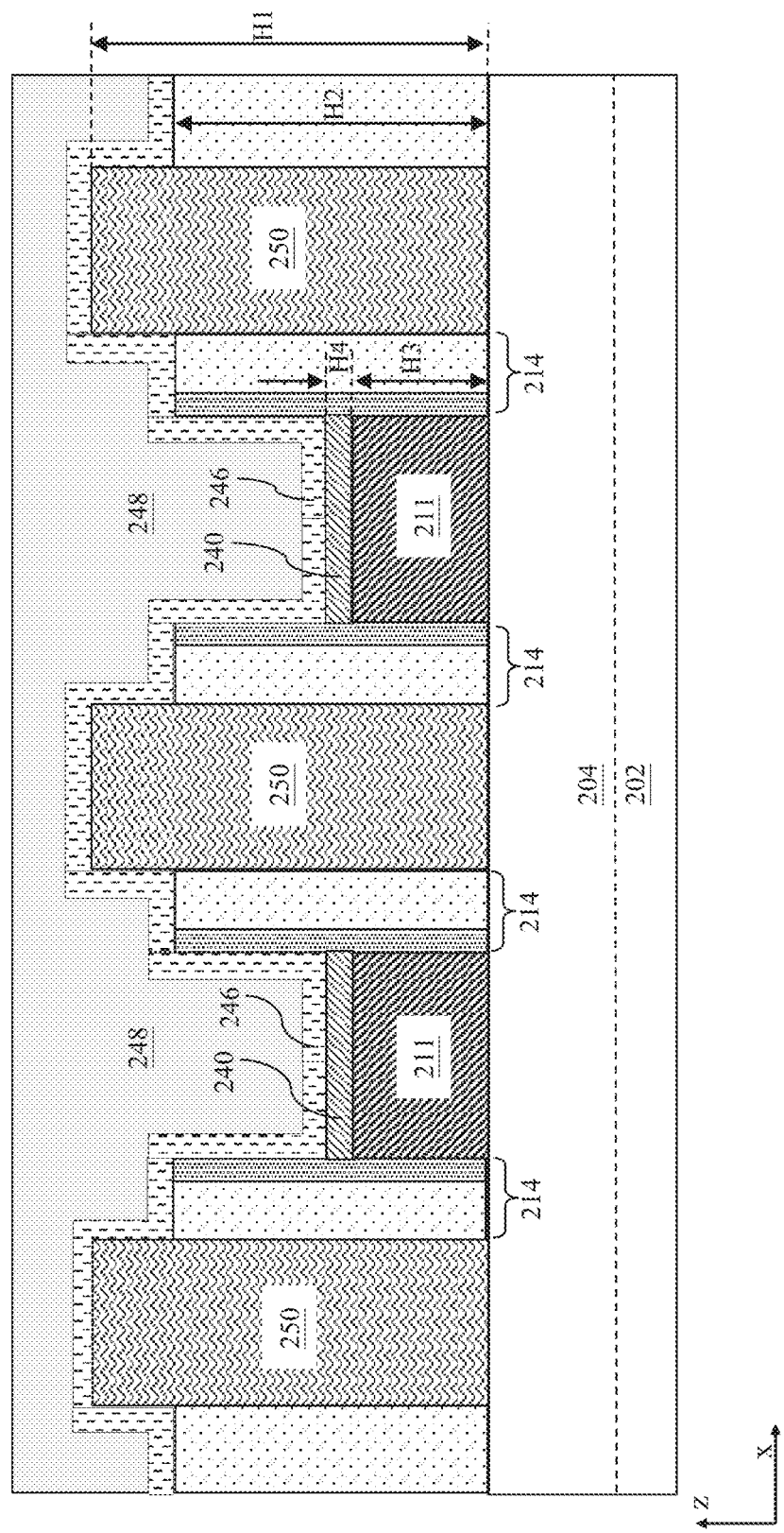

Still referring to FIGS. 1 and 10, at operation 118, a second ILD layer 248 is deposited over the first isolation feature 246. The second ILD layer 248 fills up the smaller T-shaped trenches 218' surrounded by the first isolation feature 246. In some embodiments, the second ILD layer 248 may comprise low-k dielectric material, silicon oxide (SiO), silicon nitride (SiN), silicon oxynitride (SiON), TEOS formed oxide, PSG, BPSG, other suitable dielectric material, or combinations thereof. In some implementations, the second ILD layer 248 has a multilayer structure having multiple dielectric materials. The second ILD layer 248 is formed over the first isolation feature 246 by a deposition process, such as CVD, FCVD, PVD, ALD, HDPCVD, MOCVD, RPCVD, PECVD, LPCVD, ALCVD, APCVD, plating, other suitable methods, or combinations thereof.

Figure 11:
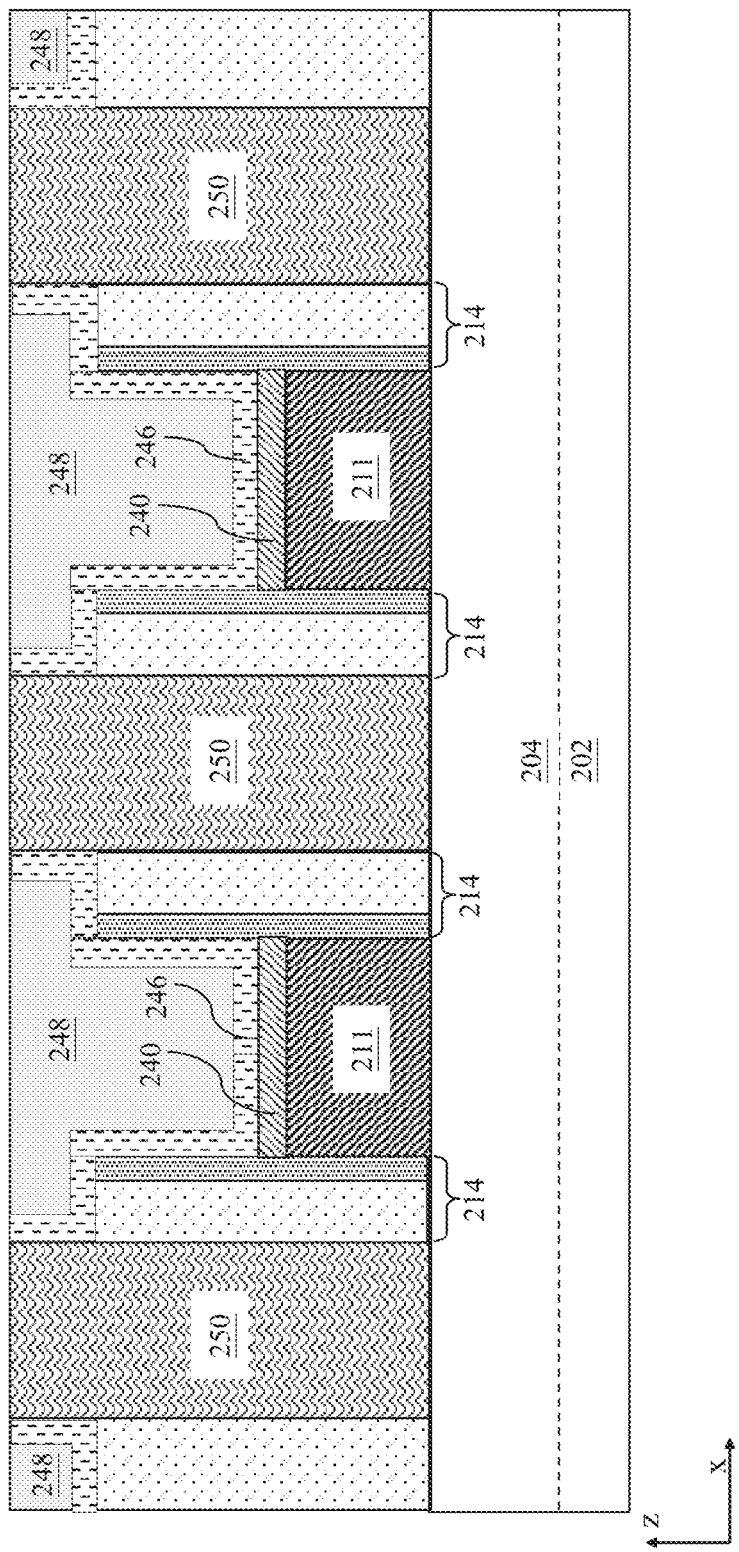

Referring to FIGS. 1 and 11, still at operation 118, a planarization process, such as a CMP, may be applied to remove any excess materials of the first isolation feature 246 and the second ILD layer 248 to expose a top surface of S/D contacts 250.

Figure 12:
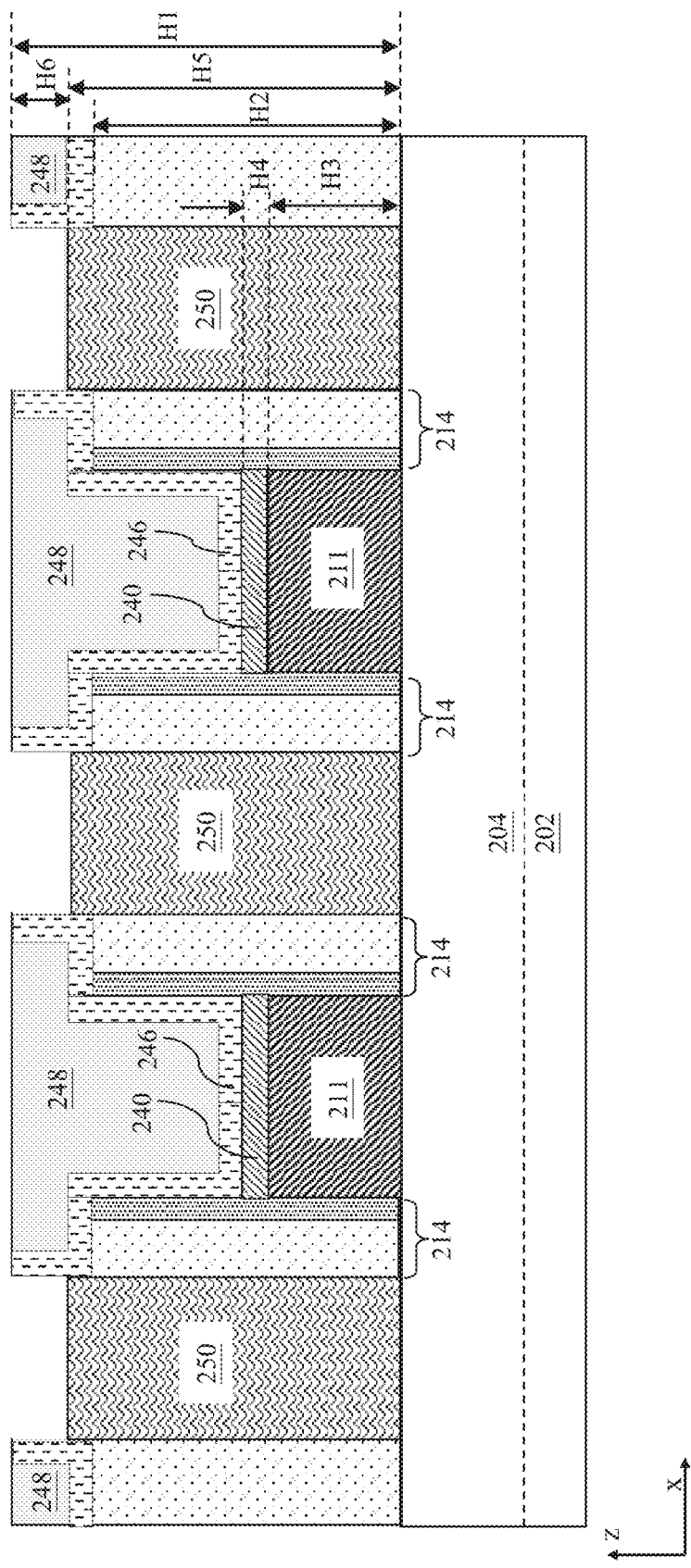

Referring to FIGS. 1 and 12, at operation 120, a top portion of the S/D contacts 250 is removed such that the S/D contacts 250 is recessed from a height H1 to a height H5. In some embodiments, as depicted in FIG. 12, the height H5 of the recessed S/D contacts 250 is larger than the height H2 of spacers 214. In other words, a top surface of the recessed S/D contacts 250 is above a top surface of spacers 214. Accordingly, the sidewalls of the recessed S/D contacts 250 contact with both the sidewalls of spacers 214 and the sidewalls of the first isolation feature 246. In some other embodiments, the height H5 of the recessed S/D contacts 250 may be less than the height H2 of spacers 214. In other words, a top surface of the recessed S/D contacts 250 is below a top surface of spacers 214. Accordingly, the sidewalls of the recessed S/D contacts 250 only contact the sidewalls of spacers 214 but do not contact the sidewalls of the first isolation feature 246. In some embodiments, the S/D contacts 250 are recessed by a reactive ion etching (RIE) process. For example, a chemical reaction plasma is generated by an electromagnetic field. High-energy ions from the plasma are released and attack the top surface of the S/D contacts 250 and react with it. The reaction time is controlled such that the S/D contacts 250 can be etched to a proper height H5 according to the design requirement of device 200. In some embodiments, the S/D contacts 250 is recessed for an extent of H6 to reach the height H5 (H5+H6=H1). In some embodiments, the recessed extent H6 is about 10% to about 60% of the height H3 of the gate stack 211. For example, the recessed extent H6 is about 1 nm to about 20 nm. In the depicted embodiment of FIG. 12, the recessed extent H6 is about 10 nm.

Figure 13:
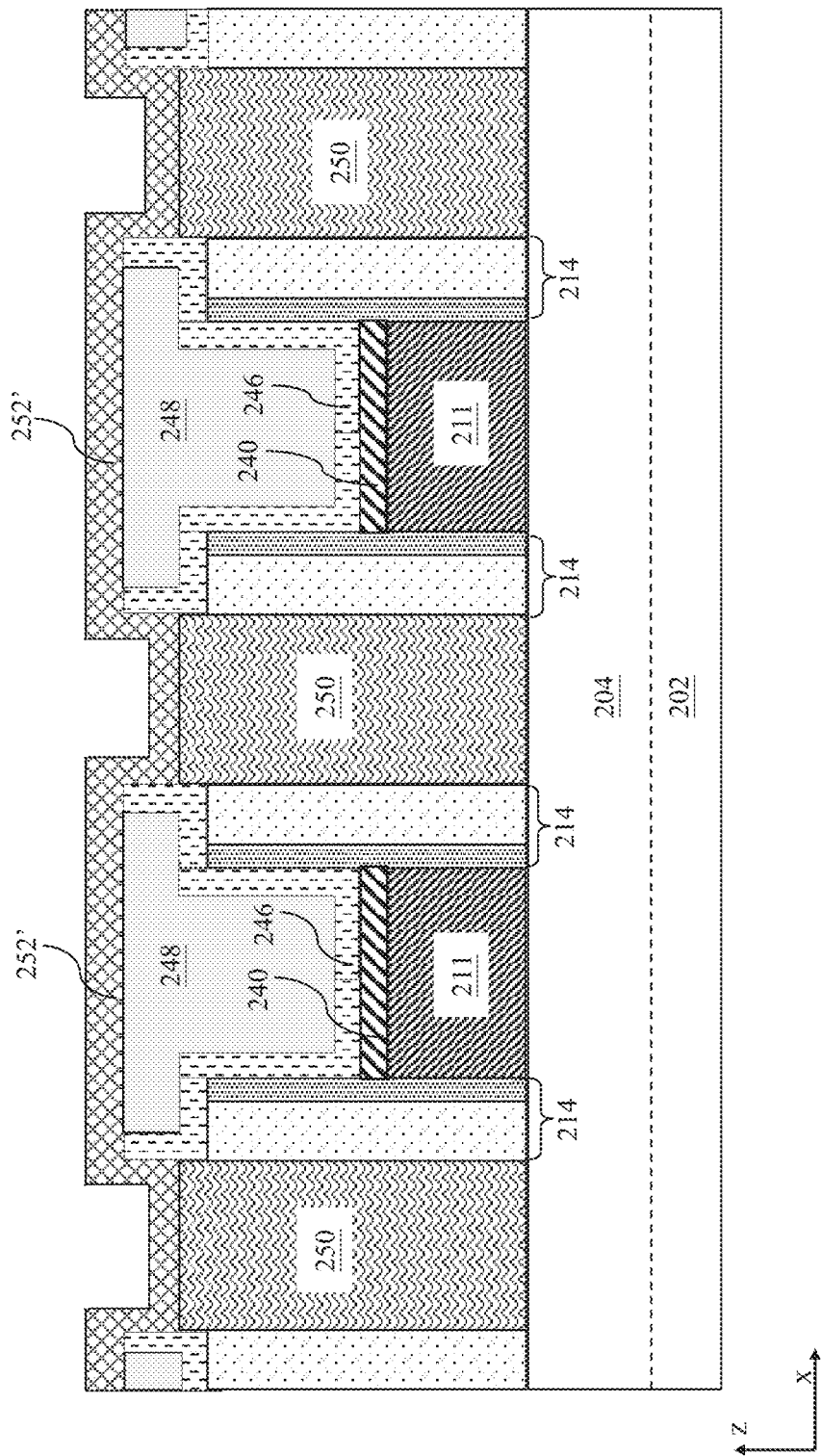
Figure 14:
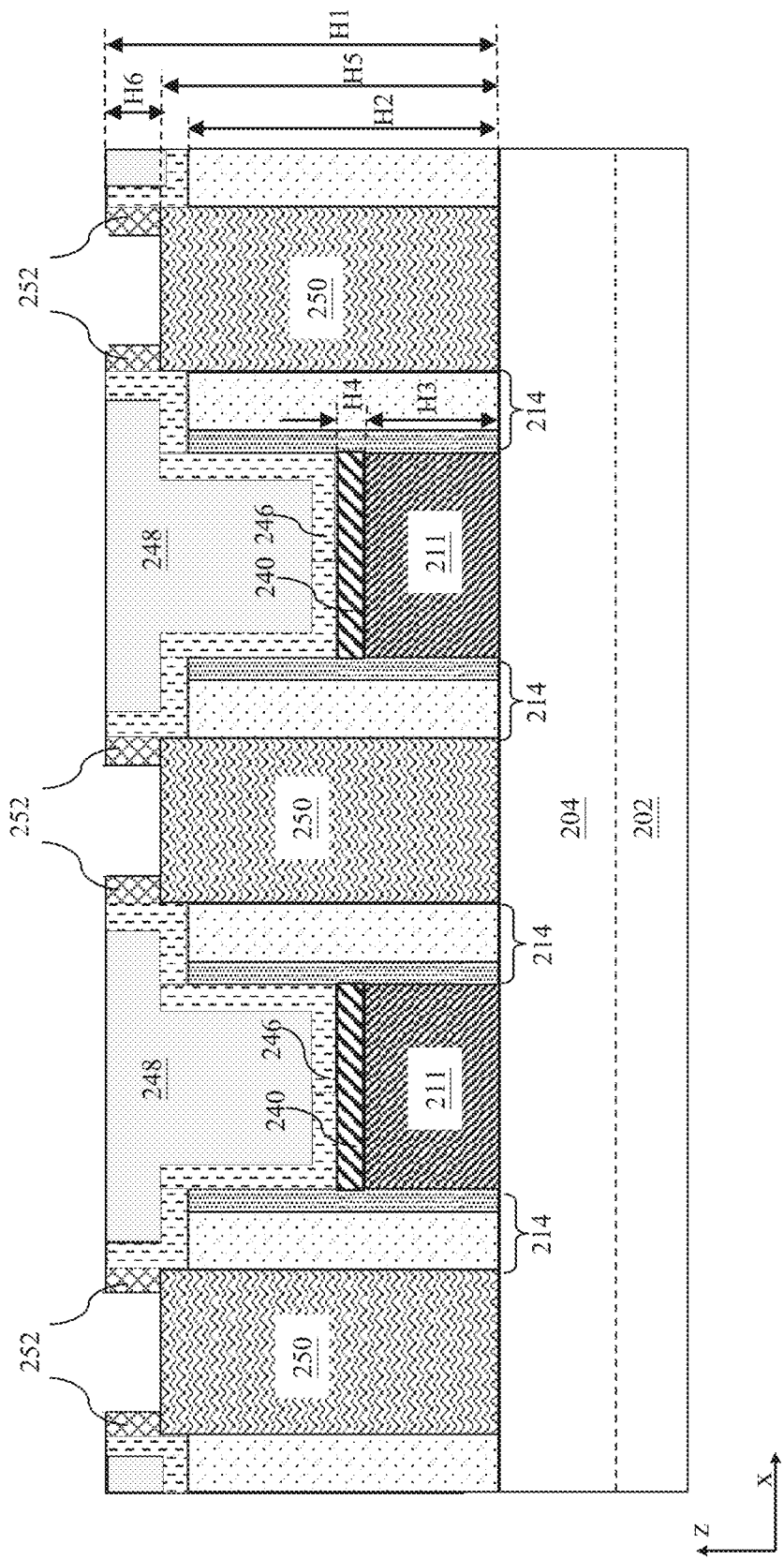

Referring to FIGS. 1, 13, and 14, at operation 122, a second isolation feature 252 is formed over S/D contact 250. In some embodiments, a dielectric material of the second isolation feature 252 includes silicon oxide (SiO), silicon nitride (SiN), silicon oxynitride (SiON), silicon oxycarbonitride (SiOCN) silicon carbonitride (SiCN), other silicon compound, nitride compound, oxide compound, or combinations thereof. The material of the second isolation feature 252 should provide good hardness and good isolation between the conductive materials of different contacts and/or vias according to the design requirement of device 200. In some embodiments, the material of the second isolation feature 252 may be the same as the material of the first isolation feature 246. In some other embodiments, the material of the second isolation feature 252 may include different material than the first isolation feature 246. The second isolation feature 252 may be formed by any suitable process. For example, as depicted in FIG. 13, in a first step, an isolation layer 252' is conformally deposited by an ALD process over substrate 202, especially over S/D contacts 250, the first isolation feature 246, and the second ILD layer 248. Subsequently in a second step, as depicted in FIG. 14, the isolation layer 252' are anisotropically etched such that only portions of the isolation layer 252' along the x-direction are removed, and portions of the isolation layer 252' along the z-direction are remained. The remained portions of the isolation layer 252' form the second isolation feature 252. In the depicted embodiment, the second isolation feature 252 is disposed above S/D contacts 250 with the outer edges align with the sidewalls of S/D contacts 250 and the inner edges enclosing a trench formed therein. The second isolation feature 252 has a height H6 in the z-direction which is equal to the etching extent H6 of S/D contacts 250. In some embodiments, the height H6 is about 1 nm to about 20 nm, which is about 10% to about 60% of the height H3 of the gate electrode. In the depicted embodiment of FIG. 14, the height H6 is about 10 nm. Compare with a conventional structure where no extra isolation feature/layer is provided between the various contacts and vias/in the present disclosure, the second isolation feature 252, independently or combined with the first isolation feature 246, may provide better isolation between various contacts and vias (for example, S/D contacts 250 and gate vias 290, or metal gate stacks 211 and S/D vias 280 illustrated in FIG. 18). Thus, the current leakage issue caused by the overlay shifting during the fabrication may be mitigated and the performance of the semiconductor may be improved.

Figure 15:
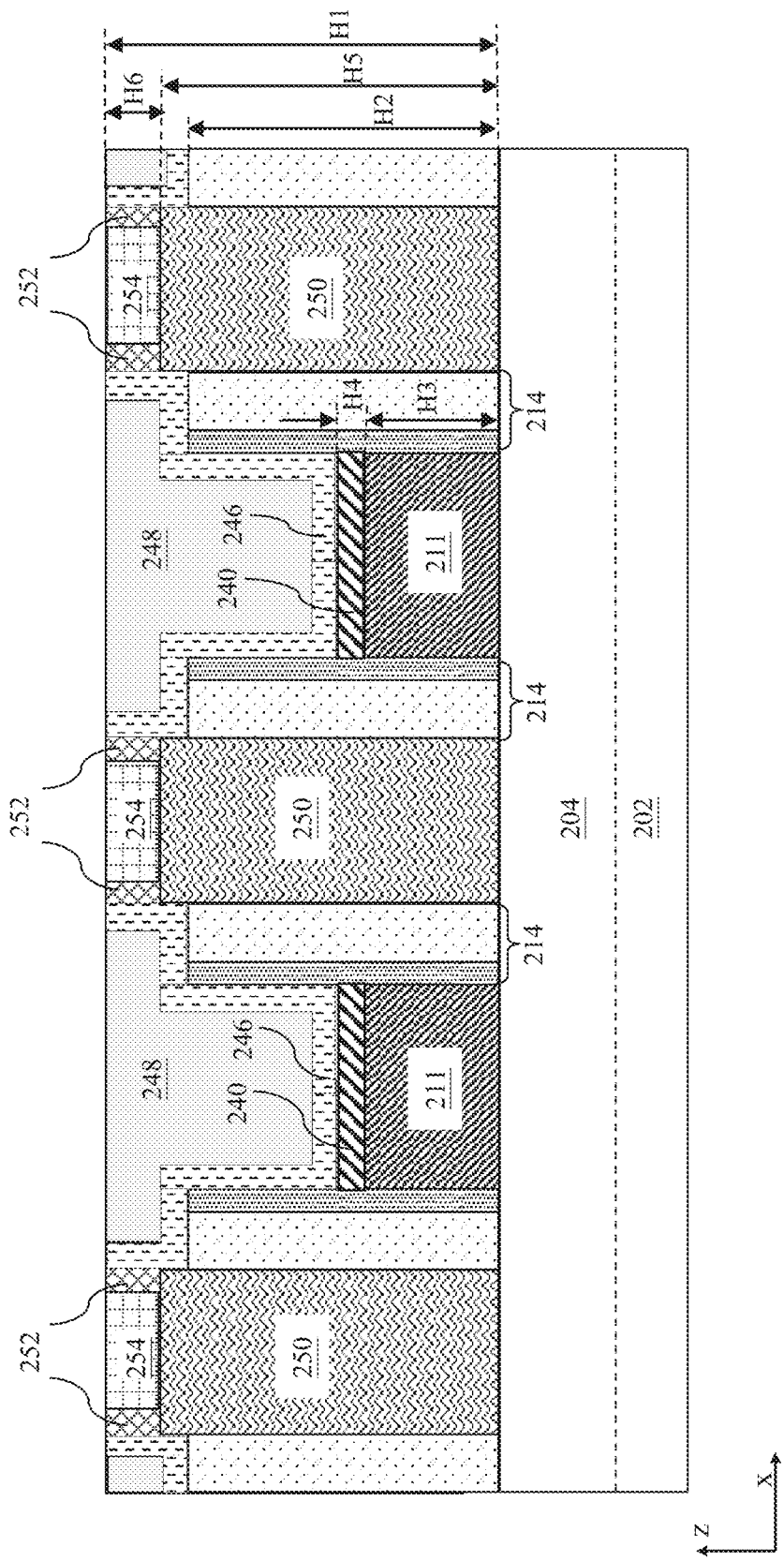
Figure 16:
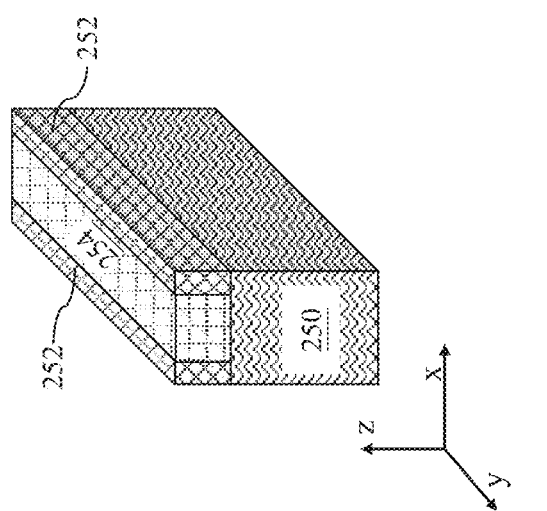
FIG. 16 illustrates a three-dimensional perspective view of the contact profiles between the S/D contacts and the second metal layer of the example semiconductor device in accordance with some embodiments of the present disclosure.

Referring to FIGS. 1, 15, and 16, at operation 124, a second metal layer 254 is deposited in the trench formed within the second isolation feature 252 and above S/D contacts 250. In some embodiments, the material of the second metal layer 254 may be the same as or different than the first metal layer 240. In some further embodiments, the material of the second metal layer 254 may be different than the material of S/D contacts 250. In some furtherer embodiments, the material of the second metal layer 254 is the same as the material of S/D via 280 (shown in FIG. 18) formed later. In some embodiments, the material of the second metal layer 254 comprises, W, Co, Al, Zr, Au, Pt, Cu, Ru, metal compound, or any combinations thereof. In some embodiments, the second metal layer 254 may be bottom-up grown from S/D contacts 250, or by other suitable process similar as the fabrication of the first metal layer 240. In some embodiments, the bottom-up grown thickness of the second metal layer 254 along the z-direction is substantially the same as the thickness H6 of the second isolation feature 252, which is about 10% to about 60% of the height H3 of the gate stacks 211. For example, the thickness H6 of the second metal layer 254 is about 1 nm to about 20 nm. In the depicted embodiment of FIG. 15, the thickness H6 of the second metal layer 254 is about 10 nm. As depicted in FIG. 16, the second metal layer 254 is deposited between the second isolation feature 252 and extending along the entire length of S/D contact in the y-direction (the direction that is perpendicular to the direction of the gate length) over S/D contact 250. In other words, the contact surface between the second metal layer 254 and the second isolation feature 252 and S/D contact 250 is the entire top surface of S/D contact 250 which is much larger than the contact surface of the S/D via and the S/D contact in a conventional structure. Similar as the first metal layer 240, the second metal layer 254 has the same material as the S/D via and enlarge the contact surface between the S/D via and the S/D contact. Thereby, the contact resistance between the S/D contacts and the S/D via is reduced, and the performance of the semiconductor device may be improved.

Figure 17:
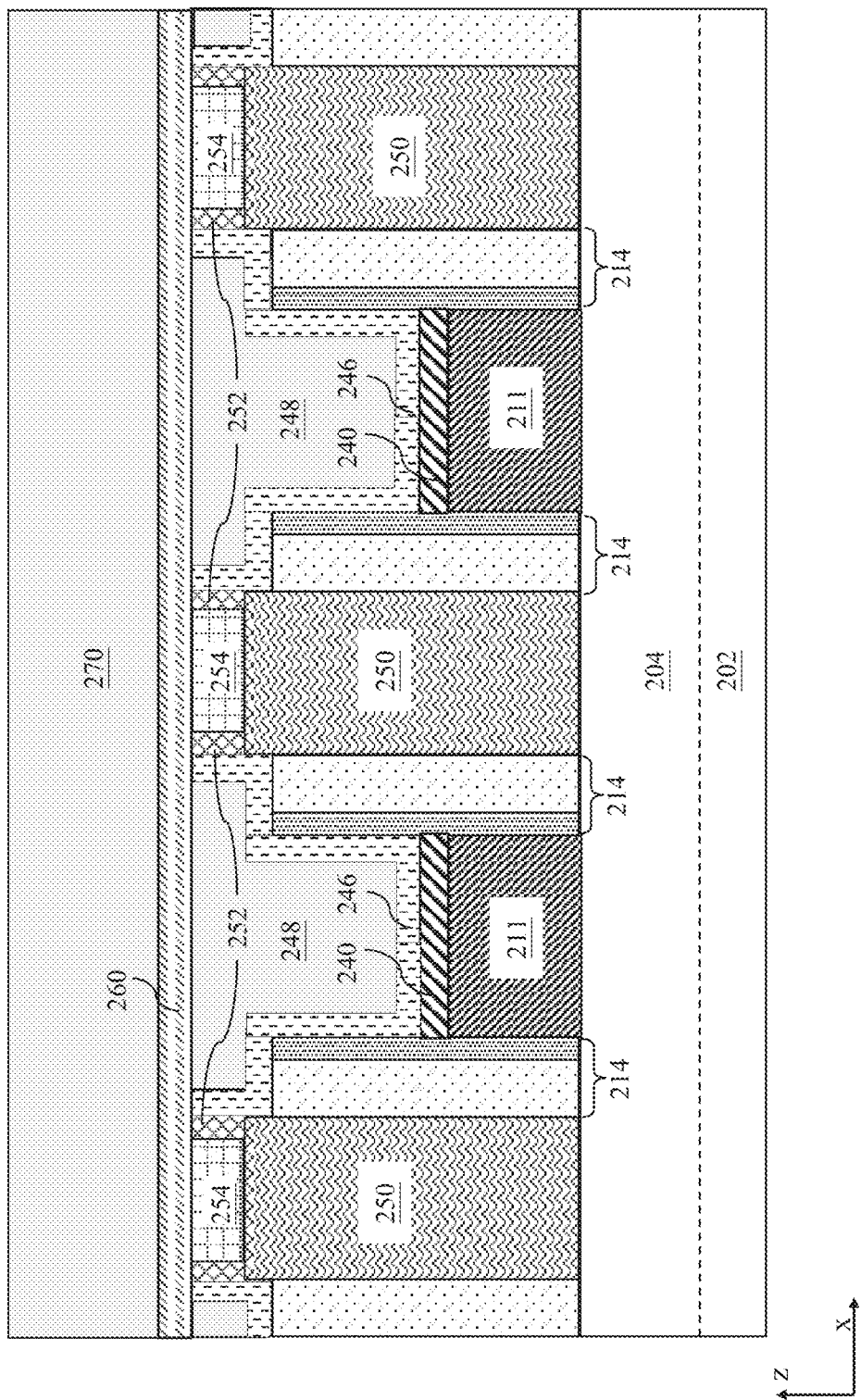

Referring to FIGS. 1 and 17, at operation 126, a contact etch stop layer (CESL) 260 is formed over substrate 202. In some embodiments, CESL 260 includes a dielectric material comprising silicon and nitrogen (for example, SiN or SiON). Also, at operation 126, a third ILD layer 270 is formed over CESL 260 and over substrate 202. In some embodiments, the third ILD layer 285 includes a dielectric material including, for example, SiO, SiN, SiON, TEOS formed oxide, PSG, BPSG, low-k dielectric material (K<3.9), other suitable dielectric material, or combinations thereof. The third ILD layer 270 includes a dielectric material different than CESL 260. In some embodiments, where CESL 260 includes silicon and nitride, the third ILD layer 270 includes a low-k dielectric material different than the dielectric material of CESL 260. In some embodiments, the third ILD layer 270 may have a multilayer structure having multiple dielectric materials. The third ILD layer 270 and/or CESL 260 are formed over substrate 202, for example, by a deposition process (such as CVD, FCVD, PVD, ALD, HDPCVD, MOCVD, RPCVD, PECVD, LPCVD, ALCVD, APCVD, plating, other suitable methods, or combinations thereof). Subsequent to the deposition of CESL 260 and/or the third ILD layer 270, a CMP process and/or other planarization process is performed to planarize the top surface of device 200. In some embodiments, a thickness along the z-direction of CESL layer 260 is about 1 nm to about 10 nm, and a thickness along the z-direction of the third ILD layer 270 is about 5 nm to about 30 nm.

Figure 18:
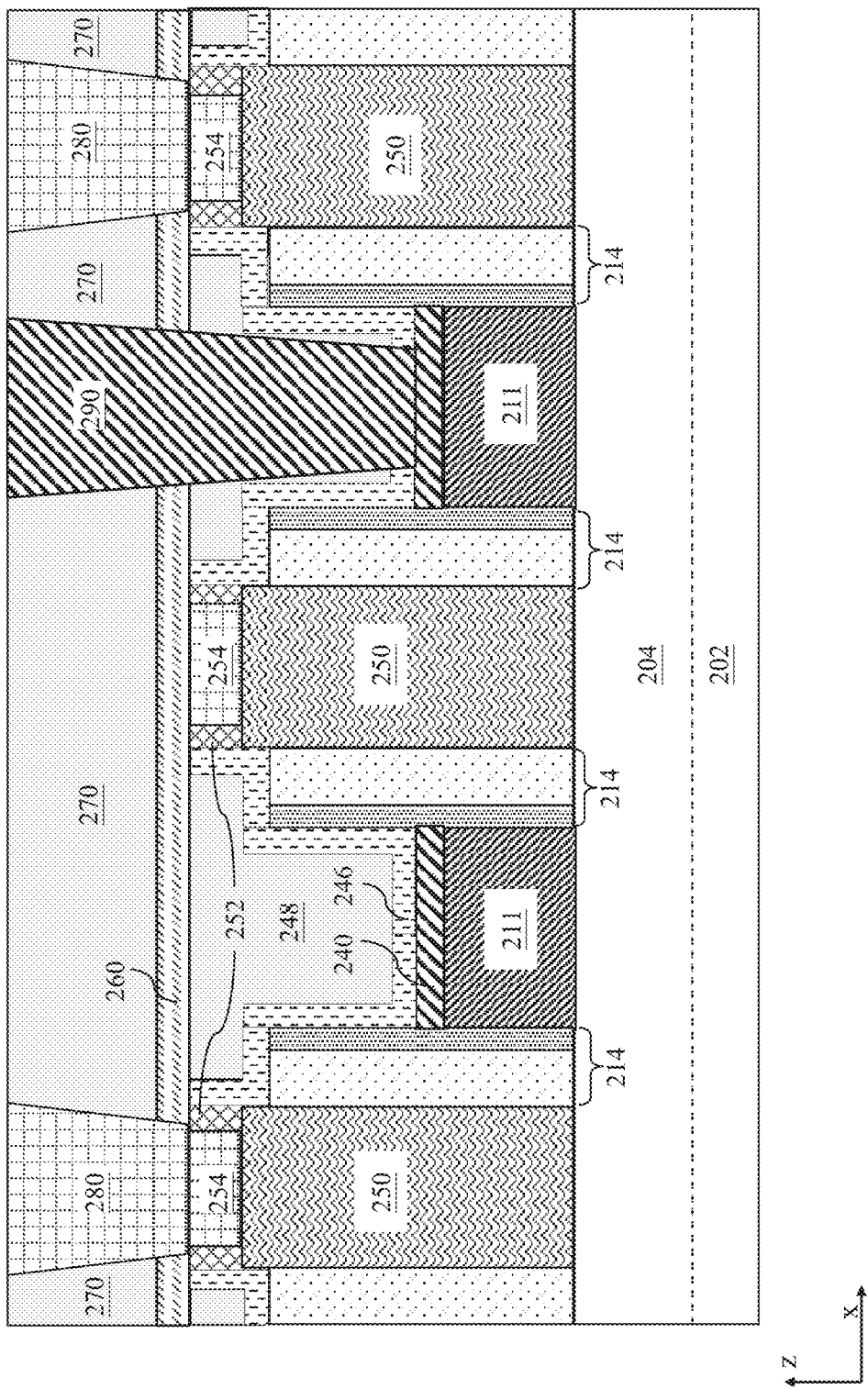

Referring to FIGS. 1 and 18, at operation 128, S/D vias 280 and gate vias 290 are formed over substrate 202 through CESL 260 and the third ILD layer 270. The material of S/D vias 280 and gate vias 290 may comprise, W, Co, Al, Zr, Au, Pt, Cu, metal compound, or any combinations thereof. To reduce the contact resistance between the source/drain vias 280 and the source/drain contacts 250, S/D vias 280 comprise the same material as the second metal layer 254. To reduce the contact resistance between the gate vias 290 and gate stacks 211, gate vias 290 comprise the same material as the first metal layer 240.

Forming of S/D vias 280 and gate vias 290 may comprises various processes. For example, in a first step, contact openings may be formed by photolithography, and/or etching processes. An exemplary photolithography process includes forming a photoresist layer (resist) overlying the third ILD layer 270, exposing the resist to a pattern, performing a post-exposure bake process, and developing the resist to form a masking element including the resist. The masking element is then used to etch the contact openings into the third ILD layer 270 and CESL 260, as well as the second ILD layer 248 and the first isolation feature 246 disposed over the first metal layer 240. The etching process may stop on the metal materials, for example, the first metal layer 240 and/or the second metal layer 254. The etching process may include a dry etching process, a wet etching process, other suitable etching process, or combinations thereof. The patterned resist layer may be removed before or after the etching process. Conductive materials are then deposited into the contact openings to form S/D vias 280 and gate vias 290.

Figure 19:
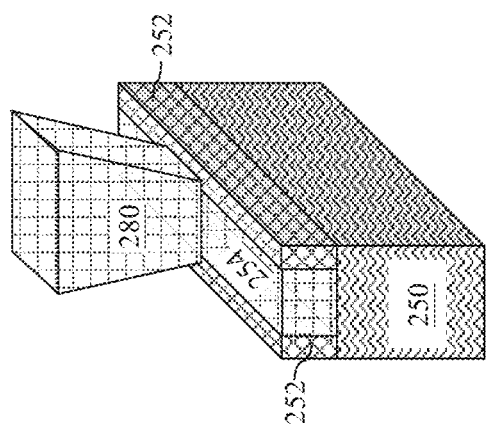
FIG. 19 illustrates three-dimensional perspective views of the contact profile of the gate electrode, the first metal layer, and the gate via of the example semiconductor device in accordance with some embodiments of the present disclosure.

FIG. 19 is a three-dimensional perspective view showing the contact profiles between S/D via 280, the second metal layer 254, and S/D contact 250. As depicted in FIG. 19, S/D via 280 and the second metal layer 254 comprise the same material (thus the resistance between S/D via 280 and the second metal layer 254 may be ignored) and a contact surface between S/D via 280 and S/D contacts 250 is enlarged by the second metal layer 254 therebetween, therefore the contact resistance between S/D contacts 250 and S/D via 280 can be reduced.

Figure 20:
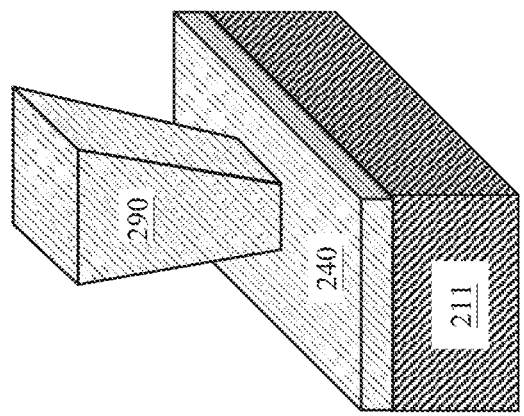
FIG. 20 illustrates three-dimensional perspective views of the contact profile of the S/D contacts, the second metal layer, and the S/D via of the example semiconductor device in accordance with some embodiments of the present disclosure.

Similarly, FIG. 20 is a three-dimensional perspective view showing the contact profiles between gate via 290, the first metal layer 240, and gate stack 211. As depicted in FIG. 20, gate via 290 and the first metal layer 240 comprise the same material (thus the resistance between gate via 290 and the first metal layer 240 may be ignored), and a contact surface between the gate via 290 and the gate stack 211 is enlarged by the first metal layer 240 therebetween, therefore the contact resistance between the metal gate (gate stack 211) and gate via 290 can be reduced. Accordingly, the performance of device 200 is improved.

In addition, as indicated in FIG. 18, various conductive contacts and vias, (for example, gate via 290 and source/drain contact 250, or metal gate stacks 211 and S/D via 280) are not only isolated by spacers 214, but also by the second ILD layer 248, the first isolation feature 246 and the second isolation feature 252. In the depicted embodiment, a top surface of gate stack 211 is lower than a top surface of spacers 214, and a top surface of spacers 214 is lower than a top surface of the second metal layer 254 (i.e. a bottom surface of S/D via 280). Therefore, in the present disclosure, the distance between gate stack 211 and S/D vias 280 is larger compared to a conventional structure. In addition, spacers 214 are recessed to be lower than a top surface of the second metal layer 254 (i.e. a bottom surface of the S/D vias 280), such that the top portion of the T-shape opening can be filled by the second ILD layer 248 and/or the first isolation feature 246 which can provide better isolation between various contacts and vias than spacers 214. Furthermore, the second isolation feature 252 disposed over S/D contact 250 and between the second metal layer 254 may further enhance the isolation between various contacts and vias. Accordingly, the currently leakage between the S/D contact and the gate via and between the metal gate and the S/D via may be mitigated compared to the conventional structure. Thus, the performance of device 200 is improved.

Referring to FIG. 1, at operation 130, method 100 performs further processing to complete the fabrication of device 200. For example, it may form other contact openings, contact metal, as well as various other contacts, vias, wires, and multilayer interconnect features (e.g., metal layers and interlayer dielectrics) over device 200, configured to connect the various features to form a functional circuit that may include the semiconductor devices.

Figure 21:
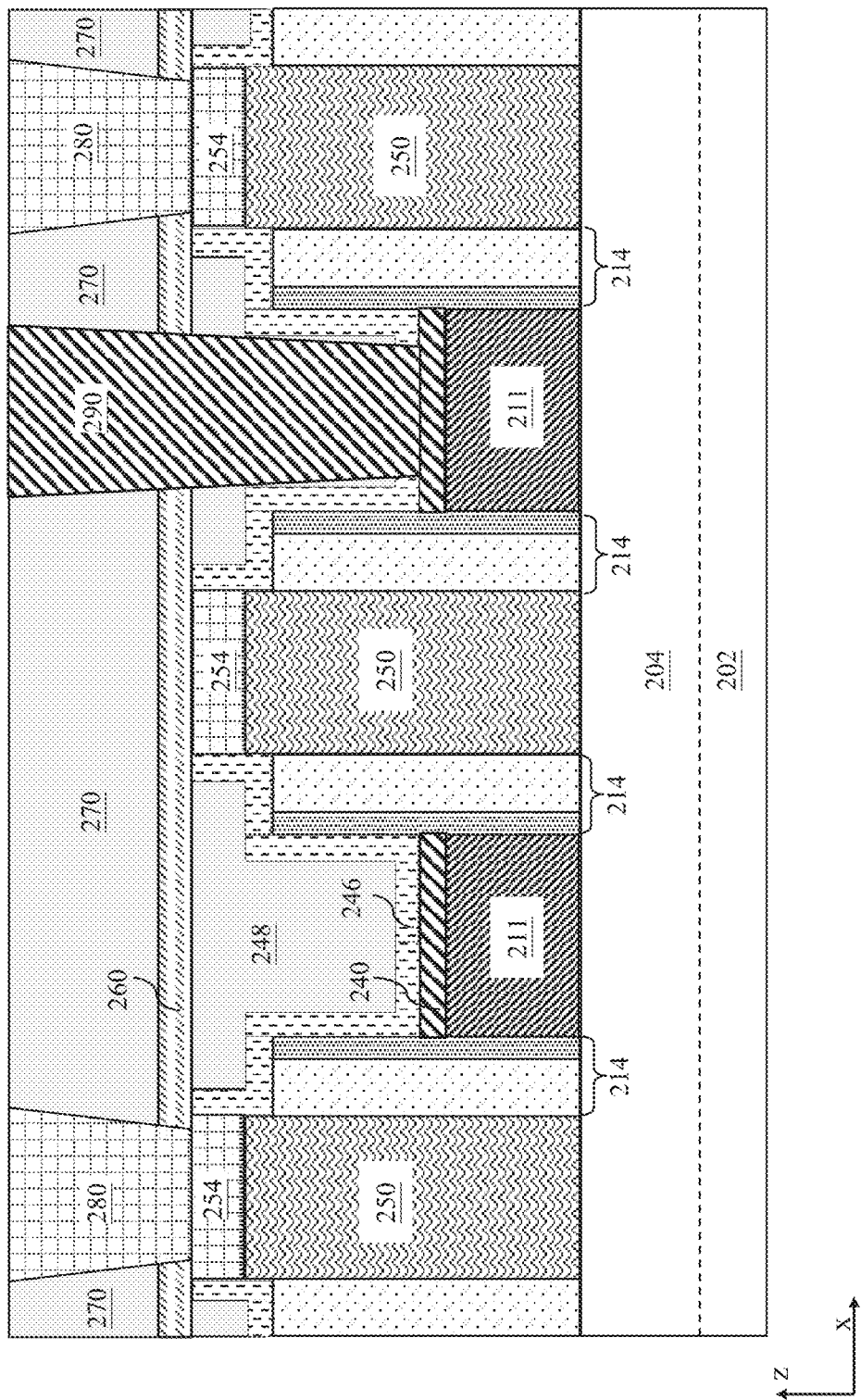
FIGS. 21-23 illustrate cross-sectional views along plane A-A shown in FIG. 2 of the example semiconductor device in accordance with various embodiments of the present disclosure.
Figure 22:
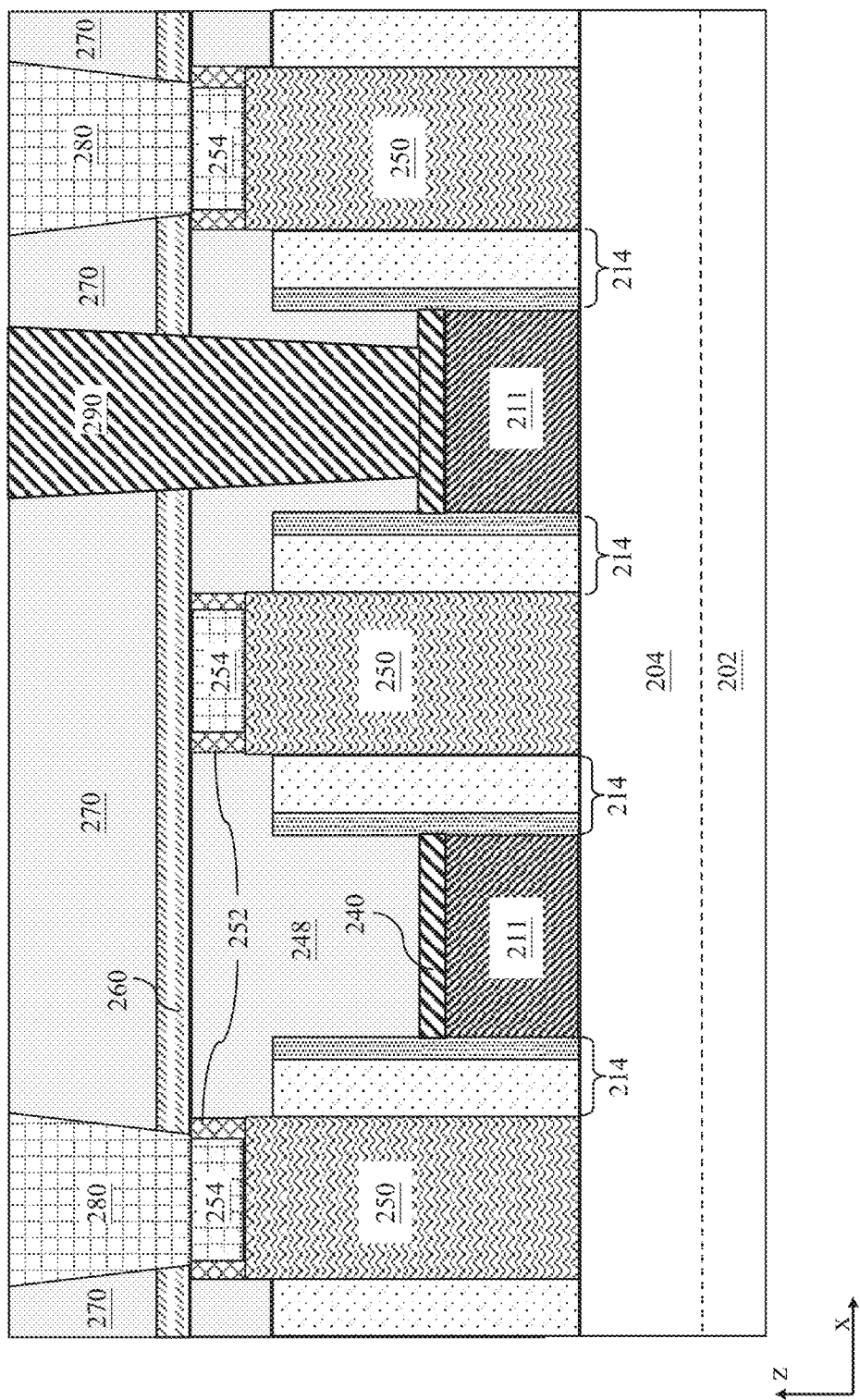
Figure 23:
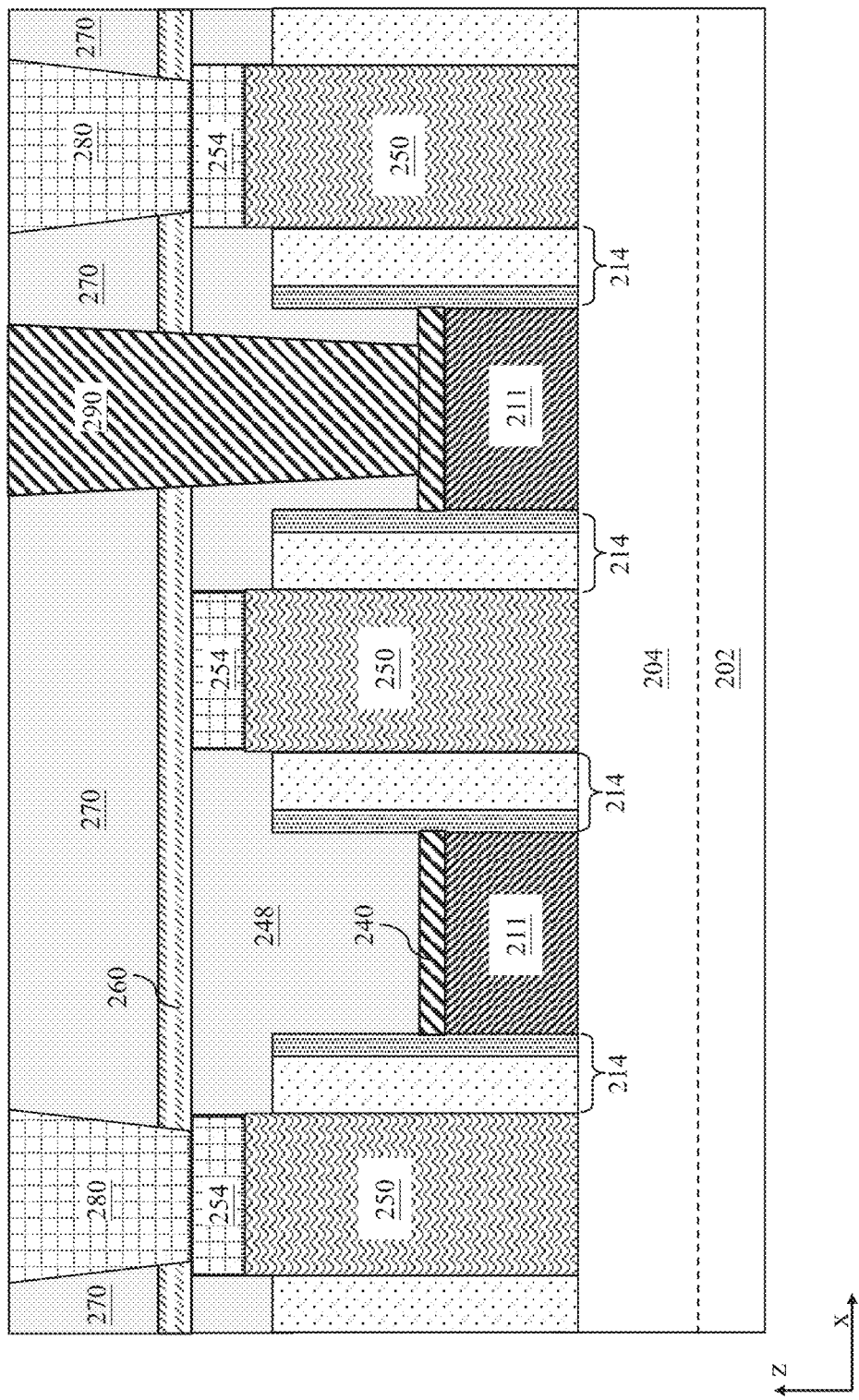

FIGS. 21-23 provide various embodiments of device 200 according to the present disclosure. The isolation features 246 and 252 are optional and one or both of them may be eliminated in these various embodiments.

For example, referring to FIG. 21, the second isolation feature 252 is not disposed over S/D contact 250 and is eliminated between the second metal layer 254 and the first isolation feature 246, such that the second metal layer 254 directly contacts the first isolation feature 246, and the edges of the second metal layer 254 aligns with the sidewalls of S/D contact 250. As depicted in FIG. 20, the first isolation feature 246 is disposed over a top surface of the first metal layer 240, extending along the sidewalls of the spacers 214 to the top surface of spacers 214, and further extending along the sidewalls of the second metal layer 254. The first isolation feature 246 is disposed to provide better isolation between gate via 290 and S/D contacts 250, and between S/D via 280 and gate stack 211. In the depicted embodiment of FIG. 21, the contact area between the second metal layer 254 and the S/D contact 250 is the entire top surface of the S/D contact 250 along the x-direction and the y-direction. The metal layers 240 and 254 (having the same material as S/D via 280 and gate 290, respectively) are disposed between the contacts (for example, S/D contacts 250 and gate stacks 211) and the vias (for example, S/D vias 280 and gate vias 290), respectively, to reduce the resistances between the contact and the vias.

Referring to FIG. 22, the first isolation feature 246 is not disposed conformally in the T-shape trench 218 between gate via 290, spacers 214, and S/D contacts 250. The top portion of the T-shape trench 218 over spacers 214 are filled by only the second ILD layer 248. The second isolation feature 252 is disposed between the second ILD layer 248 and the second metal layer 254 to provide further isolation between S/D contact 250 and the gate via 290 and between the gate stack 211 and S/D via 280. The metal layers 240 and 254 are disposed between the contacts (for example, the S/D contacts 250 and gate stacks 211) and the vias (for example, S/D vias 280 and gate vias 290), respectively, to reduce the resistances between the contacts and the vias.

Referring to FIG. 23, both the first isolation feature 246 and the second isolation feature 252 are eliminated. In the depicted embodiment, the top portion of the T-shape trench 218 over spacers 214 are filled by only the second ILD layer 248. The isolation between the gate stack 211 and the S/D via 280 and between the S/D contact 250 and the gate via 290 are enhanced by the second ILD layer 248. The contact area between the second metal layer 254 and the S/D contact 250 is the entire top surface of the S/D contact 250 along the x-direction and the y-direction. The metal layers 240 and 254 are disposed between the contacts (for example, the S/D contacts 250 and gate stacks 211) and the vias (for example, S/D vias 280 and gate vias 290), respectively, to reduce the resistances between the contact and the vias.

Although not intended to be limiting, one or more embodiments of the present disclosure provide many benefits to a semiconductor device and a formation process thereof. For example, embodiments of the present disclosure provide a semiconductor device includes metal layers between the contacts and the vias (for example, between the S/D contacts and the S/D vias, and/or between the metal gates and the gate vias). The metal layers comprise the same material as the vias and enlarge the contact surface between the contacts and the vias, thus the contact resistance between the contacts and the corresponding vias are reduced. The semiconductor device of the present disclosure may also include isolation features between the various contacts and vias, for example, between the S/D contacts and the gate vias. The isolation features provide further isolation other than the spacers between the contacts and the vias, which may mitigate the current leakage issue due to the short path between the various contacts and vias. Therefore, the performance of the semiconductor device may be improved.

The present disclosure provides for many different embodiments. Semiconductor device having metal layers and hard mask layers between contact and vias and methods of fabrication thereof are disclosed herein. An exemplary semiconductor device comprises a gate structure disposed over a substrate and over a channel region of the semiconductor device. The gate structure includes a gate stack and spacers disposed along sidewalls of the gate stack. The gate stack includes a gate dielectric layer and a gate electrode. The semiconductor device further comprises a first metal layer disposed over the gate stack, wherein the first metal layer laterally contacts the spacers over the gate dielectric layer and the gate electrode. The semiconductor device further comprises a gate via disposed over the first metal layer.

In some embodiments, a top surface of the first metal layer is below a top surface of the spacers. In some embodiments, a material of the first metal layer is the same as a material of the gate via.

In some embodiments, the semiconductor device further comprises a source/drain (S/D) contact disposed over a source/drain region of the semiconductor device; a S/D via disposed over the source/drain contact; and a second metal layer disposed between the S/D contacts and the S/D via, wherein a bottom surface of the second metal layer contacts a top surface of the S/D contact, and an area of the bottom surface of the second metal layer is greater than an area of a bottom surface of the S/D via.

In some embodiments, a material of the second metal layer is same as a material of the S/D via. In some embodiments, a top surface of the spacer is below a top surface of the second metal layer.

In some embodiments, the semiconductor device further comprises a first isolation feature formed over a top surface of the first metal layer, extending along sidewalls of the spacers to a top surface of the spacers, and further extending along a sidewall of the second metal layer.

In some embodiments, the semiconductor device further comprises a second isolation feature disposed over the S/D contact and along sidewalls of the second metal layer, wherein a sidewall of the second dielectric layer facing away from the second metal layer aligns with a sidewall of the S/D contact and a sidewall of the second dielectric layer towards the second metal layer encloses the second metal layer.

Another exemplary semiconductor device comprises a substrate including a channel region formed between source/drain (S/D) regions and a gate structure disposed over the channel region of the substrate, wherein the gate structure includes a gate stack and spacers disposed along sidewalls of the gate stack, and a top surface of the spacers is above a top surface of the gate stack. This another exemplary semiconductor device further comprises source/drain (S/D) contacts disposed over the S/D regions of the substrate; a first metal layer disposed over the S/D contacts; a S/D via having a same material as the first metal layer disposed over the first metal layer, wherein an area of a bottom surface of the S/D via is less than an area of a bottom surface of the first metal layer; and an interlayer dielectric (ILD) layer formed over the gate structure, wherein a top portion of the ILD layer extends over the top surface of the spacers.

In some embodiments, a height ratio between the gate stack and the spacer is about 20% to about 50%.

In some embodiments, this another semiconductor device further comprises a second metal layer disposed over the gate structure, wherein a top surface of the second metal layer is lower than the top surface of the spacers; and a gate via dispose over the second metal layer, wherein a material of the gate via is same as a material of the second metal layer and an area of a bottom surface of the gate via is less than an area of a bottom surface of the second metal layer.

In some embodiments, this another semiconductor device further comprises a first isolation feature disposed over the second metal layer, extending along sidewalls of the spacers to a top surface of the spacers, and further extending along a sidewall of the first metal layer.

In some embodiments, this another semiconductor device further comprises a second isolation feature disposed over the S/D contact and along a sidewall of the first metal layer, wherein the second isolation feature includes a first sidewall facing away from the first metal layer and a second sidewall towards the first metal layer, the first sidewall of the second isolation feature is align with a sidewall of the S/D contact and the second sidewall of the second isolation feature encloses the first metal layer.

In some embodiments, the bottom surface of the first metal layer and a bottom surface of the second isolation feature contact a top surface of the S/D contact.

An exemplary method comprises forming a fin over a substrate; forming a gate structure over a channel region of the fin, wherein the gate structure includes a gate stack and spacers disposed along sidewalls of the gate stack, the gate stack including a gate dielectric layer and a gate electrode; epitaxially growing a source/drain (S/D) feature over a source/drain region of the fin; forming a first interlayer dielectric (ILD) layer over the S/D feature and the substrate, recessing the gate structure including the spacers and the gate stack, such that a top surface of the spacers is lower than a top surface of the first ILD layer and a top surface of the gate stack is lower than the top surface of the spacers; and forming a first metal layer, by a bottom-up grow process, over the gate stack, wherein the first metal layer covers the top surface of the gate stack including the gate dielectric layer and the gate electrode.

In some embodiments, recessing the gate structure comprises etching the spacers and the gate stack together, such that the top surface of the spacers and the gate stack is lower than the top surface of the first ILD layer; and further etching the gate stack, such that the top surface of the gate electrode is lower than the top surface of the spacers, and a T-shape trench is formed over the gate stack and the spacers.

In some embodiments, the method further comprises etching the first ILD layer to form a S/D contact opening; forming a S/D contact in the S/D contact opening; depositing a second ILD layer over the first metal layer and the spacers; and forming a gate via through the second ILD layer and contacting the first metal layer, wherein the gate via includes a same material as the first metal layer and an area of a bottom surface of the gate via is smaller than an area of a bottom surface of the first metal layer.

In some embodiments, the method further comprises forming a first isolation feature after forming the first metal layer and before depositing the second ILD layer, wherein the first isolation feature is deposited over a top surface of the first metal layer, extending along sidewalls of the spacers, over the top surface of the spacers, and further along a sidewall of the S/D contact.

In some embodiments, the method further comprises recessing a top portion of the S/D contact; and forming a second isolation feature over the recessed S/D contact, wherein the second isolation feature includes a first sidewall contacting the first isolation feature and a second sidewall facing away from the first isolation feature, the first sidewall is align with a sidewall of the recessed S/D contact, the second sidewall forms a trench therein and a portion of a top surface of the recessed S/D contacts is exposed through the trench.

In some embodiments, the method further comprises forming a second metal layer to cover the top surface of the recessed S/D contacts exposed in the trench; and forming a S/D via over the second metal layer, wherein the S/D via includes a same material as the second metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a gate structure on a fin structure, the gate structure including a gate stack and a first sidewall spacer disposed along a sidewall of the gate stack, the gate stack including a gate electrode layer and a gate dielectric layer;
forming a first interlayer dielectric layer over the gate structure;
recessing the gate stack and the first sidewall spacer such that respective top surfaces of the gate stack and the first sidewall spacer are lower than a top surface of the first interlayer dielectric layer;
forming a first metal layer directly on the top surface of the gate stack, wherein a top surface of the first metal layer is below the top surface of the first sidewall spacer after the forming of the first metal layer directly on the top surface of the gate stack;
forming a first isolation layer on the first metal layer and the first sidewall spacer;
forming a first trench through the first isolation layer to expose a portion of the first metal layer; and
forming a first conductive feature on the exposed portion of the first metal layer in the trench.

2. The method of claim 1, further comprising:
forming a sacrificial layer on the first metal layer and the first sidewall spacer prior to forming the first isolation layer on the first metal layer and the first sidewall spacer;
forming a second trench through the first interlayer dielectric layer and the sacrificial layer;
forming a second conductive feature in the second trench.

3. The method of claim 2, further comprising removing the sacrificial layer to expose the top surface of the first metal layer and a sidewall surface of the second conductive feature.

4. The method of claim 3, wherein the forming of the first isolation layer on the first metal layer and the first sidewall spacer includes forming the first isolation layer directly on the exposed top surface of the first metal layer and directly on the sidewall surface of the second conductive feature.

5. The method of claim 1, further comprising forming a second interlayer dielectric layer directly on the first isolation layer, wherein the second interlayer dielectric layer extends below the top surface of the first sidewall spacer, and
wherein the forming of the first trench through the first isolation layer to expose the portion of the first metal layer includes forming the first trench through the second interlayer dielectric layer.

6. The method of claim 1, further comprising:
forming a second trench through the first interlayer dielectric layer;
forming a second conductive feature in the second trench;
removing a first portion of the first isolation layer to expose a first portion of the second conductive feature; and
removing the first portion of the second conducive feature.

7. The method of claim 6, wherein a second portion of the second conductive feature remains after the removing of the first portion of the second conducive feature, the second portion of the second conductive feature having a top surface that is above the top surface of the first sidewall spacer.

8. A method of forming a semiconductor device, comprising:
forming a fin over a substrate;
forming a gate structure over a channel region of the fin, wherein the gate structure includes a gate stack and spacers disposed along sidewalls of the gate stack, the gate stack including a gate dielectric layer and a gate electrode;
epitaxially growing a source/drain (S/D) feature over a source/drain region of the fin;
forming a first interlayer dielectric (ILD) layer over the S/D feature and the substrate;
recessing the gate structure including the spacers and the gate stack, such that a top surface of the spacers is lower than a top surface of the first ILD layer and a top surface of the gate stack is lower than the top surface of the spacers; and
forming a first metal layer, by a bottom-up grow process, over the gate stack, wherein the first metal layer covers the top surface of the gate stack including the gate dielectric layer and the gate electrode.

9. The method of claim 8, wherein recessing the gate structure comprises:
etching the spacers and the gate stack together, such that the top surface of the spacers and the gate stack is lower than the top surface of the first ILD layer; and
further etching the gate stack, such that the top surface of the gate electrode is lower than the top surface of the spacers, and a T-shape trench is formed over the gate stack and the spacers.

10. The method of claim 8, further comprising:
etching the first ILD layer to form a S/D contact opening;
forming a S/D contact in the S/D contact opening;
depositing a second ILD layer over the first metal layer and the spacers; and
forming a gate via through the second ILD layer and contacting the first metal layer, wherein the gate via includes a same material as the first metal layer and an area of a bottom surface of the gate via is smaller than an area of a bottom surface of the first metal layer.

11. The method of claim 10, further comprising:
forming a first isolation feature after forming the first metal layer and before depositing the second ILD layer, wherein the first isolation feature is deposited over a top surface of the first metal layer, extending along sidewalls of the spacers, over the top surface of the spacers, and further along a sidewall of the S/D contact.

12. The method of claim 8, further comprising:
recessing a top portion of the S/D contact; and
forming a second isolation feature over the recessed S/D contact, wherein the second isolation feature includes a first sidewall contacting the first isolation feature and a second sidewall facing away from the first isolation feature, the first sidewall is align with a sidewall of the recessed S/D contact, the second sidewall forms a trench therein and a portion of a top surface of the recessed S/D contacts is exposed through the trench.

13. The method of claim 12, further comprising:
forming a second metal layer to cover the top surface of the recessed S/D contacts exposed in the trench; and
forming a S/D via over the second metal layer, wherein the S/D via includes a same material as the second metal layer.

14. A method comprising:
forming a gate structure on a fin, the gate structure including a gate electrode layer and a gate dielectric layer;
forming a source/drain feature on the fin;
forming a first interlayer dielectric layer over the gate structure;
recessing the gate structure such that a top surface of the gate structure is lower than a top surface of the first interlayer dielectric layer;
forming a first metal layer directly on at least one of the gate electrode layer and the gate dielectric layer;
forming a first conductive feature extending through the first interlayer dielectric layer to the source/drain feature;
forming a first isolation layer directly on the first metal layer;
forming a second isolation layer directly on the first conductive feature and the first isolation layer; and
forming a first trench through the first isolation layer to expose a portion of the first metal layer;
forming a second conductive feature in the first trench directly on the portion of the first metal layer.

15. The method of claim 14, further comprising:
removing a first portion of the second isolation layer to expose a first portion of the first conductive feature; and
forming a second metal layer directly on the second portion of the first conductive feature.

16. The method of claim 15, wherein the forming of the second metal layer directly on the first conductive feature occurs prior to the forming of the second conductive feature in the first trench.

17. The method of claim 14, wherein the first isolation layer is formed of a different material than the second isolation layer.

18. The method of claim 14, wherein the first isolation layer is formed of the same material as the second isolation layer.

19. The method of claim 14, wherein the forming of the first metal layer directly on at least one of the gate electrode layer and the gate dielectric layer includes forming the first metal layer directly on the gate electrode layer and the gate dielectric layer.

20. The method of claim 14, further comprising forming a second interlayer dielectric layer on the first isolation layer prior to the forming of the second isolation layer directly on the first conductive feature and the first isolation layer.

* * * * *